(12) United States Patent
Kanaya

(10) Patent No.: US 11,121,343 B2
(45) Date of Patent: Sep. 14, 2021

(54) DISPLAY DEVICE

(71) Applicant: Japan Display Inc., Tokyo (JP)

(72) Inventor: Heisuke Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/779,716

(22) Filed: Feb. 3, 2020

(65) Prior Publication Data

US 2020/0176708 A1 Jun. 4, 2020

Related U.S. Application Data

(63) Continuation of application No. 16/221,731, filed on Dec. 17, 2018, now Pat. No. 10,586,945, which is a (Continued)

(30) Foreign Application Priority Data

Nov. 28, 2016 (JP) .............................. JP2016-230245

(51) Int. Cl.
*H01L 51/52* (2006.01)
*H01L 51/50* (2006.01)
(Continued)

(52) U.S. Cl.
CPC ...... *H01L 51/5246* (2013.01); *H01L 27/1248* (2013.01); *H01L 27/326* (2013.01);
(Continued)

(58) Field of Classification Search
CPC ......... H01L 29/42384; H01L 29/78666; H01L 29/78669; H01L 51/5246; H01L 51/5084; H01L 51/5253; H01L 51/504
See application file for complete search history.

(56) References Cited

U.S. PATENT DOCUMENTS 9,508,782 B2    11/2016  Park et al.
9,997,738 B2 *   6/2018  Choi ................... H01L 51/5253
(Continued)

FOREIGN PATENT DOCUMENTS

JP    2014-235212 A    12/2014
JP    2014-235790 A    12/2014

OTHER PUBLICATIONS

Japanese Office Action dated Jun. 9, 2020 for the corresponding Japanese patent application No. 2016-230245, with partial English machine translation retrieved from the Global Dossier.

*Primary Examiner* — Hsien Ming Lee
(74) *Attorney, Agent, or Firm* — Michael Best & Friedrich LLP

(57) ABSTRACT

A display device includes a substrate, a plurality of pixels above the substrate, each of the pixels including a light emitting element, a display region including the plurality of pixels, a thin film transistor which each of the plurality of pixels includes, a protective film including a first inorganic insulating material and located between the thin film transistor and the light emitting element, a sealing film including a second inorganic insulating material and covering the light emitting element, and at least one through hole located in the display region and passing through the substrate, the protective film, and the sealing film, wherein the second inorganic insulating material is in direct contact with the protective film in a first region located between the through hole and the pixels.

4 Claims, 20 Drawing Sheets

Related U.S. Application Data continuation of application No. 15/813,240, filed on Nov. 15, 2017, now Pat. No. 10,193,102.

(51) Int. Cl.
*H01L 29/786* (2006.01)
*H01L 29/423* (2006.01)
*H01L 27/32* (2006.01)
*H01L 51/00* (2006.01)
*H01L 27/12* (2006.01)

(52) U.S. Cl.
CPC ...... *H01L 27/3258* (2013.01); *H01L 27/3262* (2013.01); *H01L 29/42384* (2013.01); *H01L 29/78666* (2013.01); *H01L 29/78669* (2013.01); *H01L 51/0097* (2013.01); *H01L 51/504* (2013.01); *H01L 51/5056* (2013.01); *H01L 51/5084* (2013.01); *H01L 51/5234* (2013.01); *H01L 51/5237* (2013.01); *H01L 51/5253* (2013.01); *H01L 2251/5338* (2013.01); *Y02E 10/549* (2013.01)

(56) References Cited

U.S. PATENT DOCUMENTS

| | | | |
|---|---|---|---|
| 10,205,122 B2 | 2/2019 | Choi et al. | |
| 2003/0063229 A1* | 4/2003 | Takahashi | G02F 1/136286 349/43 |
| 2017/0148856 A1* | 5/2017 | Choi | H01L 51/5253 |

* cited by examiner

DISPLAY DEVICE

CROSS REFERENCE TO RELATED APPLICATIONS

This application is a continuation of U.S. patent application Ser. No. 16/221,731, filed on Dec. 17, 2018, which, in turn, is a continuation of U.S. patent application Ser. No. 15/813,240 (now U.S. Pat. No. 10,193,102), filed on Nov. 15, 2017. Further, this application is based upon and claims the benefit of priority from the prior Japanese Patent Application No. 2016-230245, filed on Nov. 28, 2016, the entire contents of which are incorporated herein by reference.

FIELD

An embodiment of the present invention is related to a structure of a display region in a display device.

BACKGROUND

Conventionally, an organic EL display device (Organic Electroluminescence Display) using an organic electroluminescence material (organic EL material) in a light emitting element (organic EL element) of a display part is known as a display device. Unlike a liquid crystal display device or the like, an organic EL display device is a so-called self-light emitting type display device that realizes display by causing an organic EL material to emit light.

In recent years, in this type of organic EL display device, a display with various shapes having through-holes in a display region has been developed. For example, an organic EL display device has been disclosed in which a through hole passing through a display region is arranged in a display panel as a vehicle display meter (for example, Japanese Patent Laid-Open Publication No. 2014-235790).

SUMMARY

A display device in an embodiment according to the present invention includes a substrate, a plurality of pixels above the substrate, each of the pixels including a light emitting element, a display region including the plurality of pixels, a thin film transistor which each of the plurality of pixels includes, a protective film including a first inorganic insulating material and located between the thin film transistor and the light emitting element, a sealing film including a second inorganic insulating material and covering the light emitting element, and at least one through hole located in the display region and passing through the substrate, the protective film, and the sealing film, wherein the second inorganic insulating material is in direct contact with the protective film in a first region located between the through hole and the pixels.

A display device in an embodiment according to the present invention includes a substrate, a plurality of pixels above the substrate, each of the pixels including a light emitting element, a display region including the plurality of pixels a sealing film covering the light emitting element and including a first inorganic insulating layer, an organic insulating layer, and a second inorganic insulating layer, and a through hole located in the display region and passing through the substrate and the sealing film, wherein the light emitting element, the first inorganic insulating layer, the organic insulating layer, and the second inorganic insulating layer are stacked in this order, and the first inorganic insulating film is in direct contact with the second inorganic insulating film in a first region located the through hole and the pixels.

A display device in an embodiment according to the present invention includes a display panel having a substrate and a display region including a plurality of pixels, and a through hole located in the display region and passing through the display panel, wherein a region where an organic insulating film does not locate above the substrate is located between the through hole and the pixels.

DESCRIPTION OF EMBODIMENTS

Each embodiment of the present invention is explained below while referring to the diagrams. However, it is possible to perform the present invention using many different forms within a scope that does not depart from the intention of the invention and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to similar elements and elements that have been mentioned in previous drawings, and therefore a detailed explanation may be omitted where appropriate.

In the present invention, when a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

Furthermore, in the present specification, expressions such as "above", "below" when explaining the diagrams express a relative relationship between a structure focused on and other structures. In the present specification, a direction from a first substrate towards a pixel electrode in a side surface view is defined as "above" and the reverse direction is defined as [below]. In the present specification and scope of the patent claims, when expressing a form in which a certain structure is arranged above another certain structure, as long as there is no particular limitation, these include parts which are not only directly above other parts or regions but also in an upper direction. That is, in the case where certain parts or regions are given as other parts or regions, other structural elements may be included between other parts or regions in an upper direction.

FIRST EMBODIMENT

Figure 1:
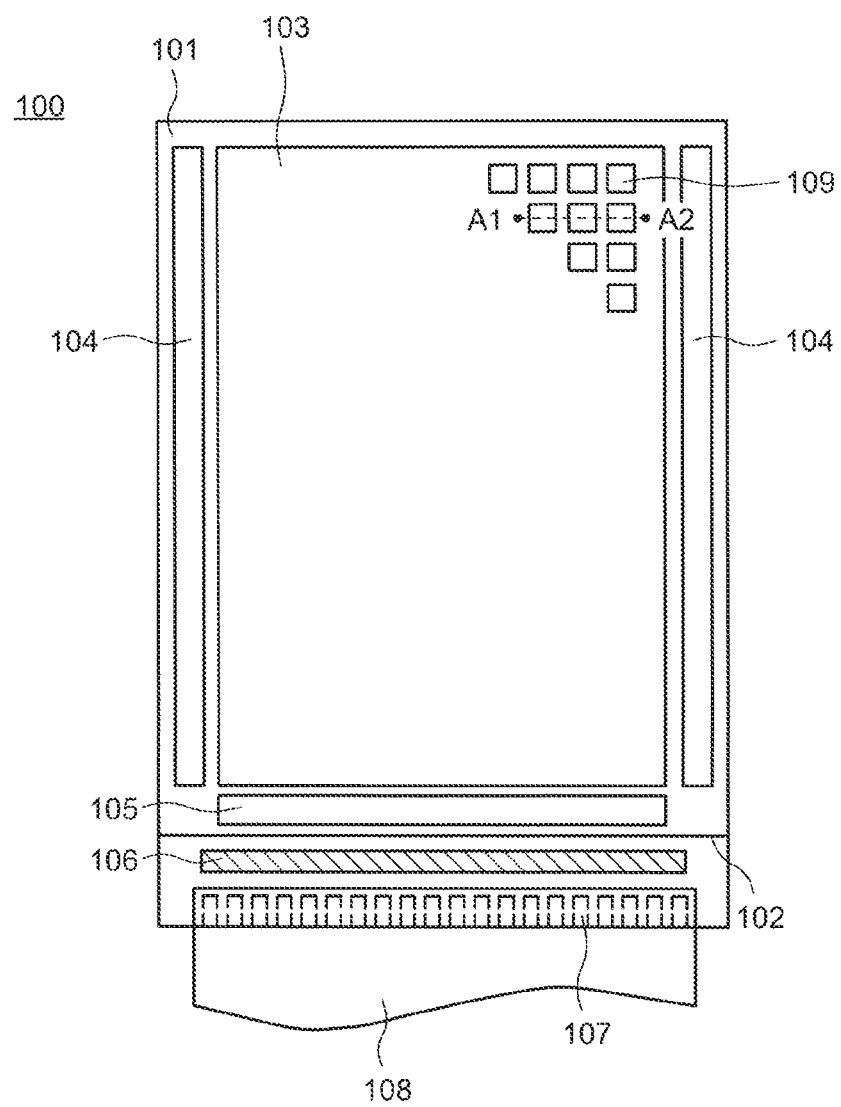
FIG. 1 is a schematic view showing a structure of a display device related to one embodiment of the present invention.

FIG. 1 is a schematic view showing a structure of a display device 100 according to one embodiment of the present invention, and shows a schematic structure in the case when the display device 100 is seen in a planar view. In the present specification, a state of the display device 100 when viewed from a direction perpendicular to a screen (display region) is referred to as "planar view".

As shown in FIG. 1, the display device 100 includes a display region 103, a scanning line drive circuit 104, a data line drive circuit 105 and a driver IC 106 formed above a first substrate 101. The driver IC 106 functions as a control part which provides signals to the scanning line driving circuit 104 and the data line driving circuit 105. The data line driving circuit 105 may be incorporated within the driver IC 106. The driver IC 106 may be arranged above the first substrate 101 in the form of an IC chip, or may be arranged on a flexible printed circuit (FPC) 108. The flexible printed circuit 108 is connected to a terminal 107 arranged above the first substrate 101. In addition, a counter substrate 102 described later is arranged facing the first substrate 101. Furthermore, the first substrate 101 and constituent elements which are deposited or bonded on a main surface of the first substrate 101 are collectively referred to as a display panel.

Here, the first substrate 101 is formed from an insulating material and supports each layer such as a pixel electrode and an insulating layer arranged on a surface of the first substrate 101. Furthermore, an insulating film (underlayer film) may be formed directly in contact with the surface of the first substrate 101. The material of the first substrate 101 and the material forming the insulating film are not particularly limited.

The display region 103 shown in FIG. 1, a plurality of pixels 109 are arranged in a matrix. Each of the pixels 109 includes a light-emitting element constituted a pixel electrode (anode), an organic layer (light-emitting section) including a light-emitting layer stacked on the pixel electrode, and a counter electrode (cathode). A data signal corresponding to image data is provided to each pixel 109 from the data line driving circuit 105. According to these data signals, a transistor electrically connected to a pixel electrode arranged in each pixel 109 is driven and it is possible to perform a screen display according to the image data. Typically, a thin film transistor (TFT) can be used as the transistor. However, the transistor is not limited to a thin film transistor and any element may be used as long as it has a current control function.

Figure 2:
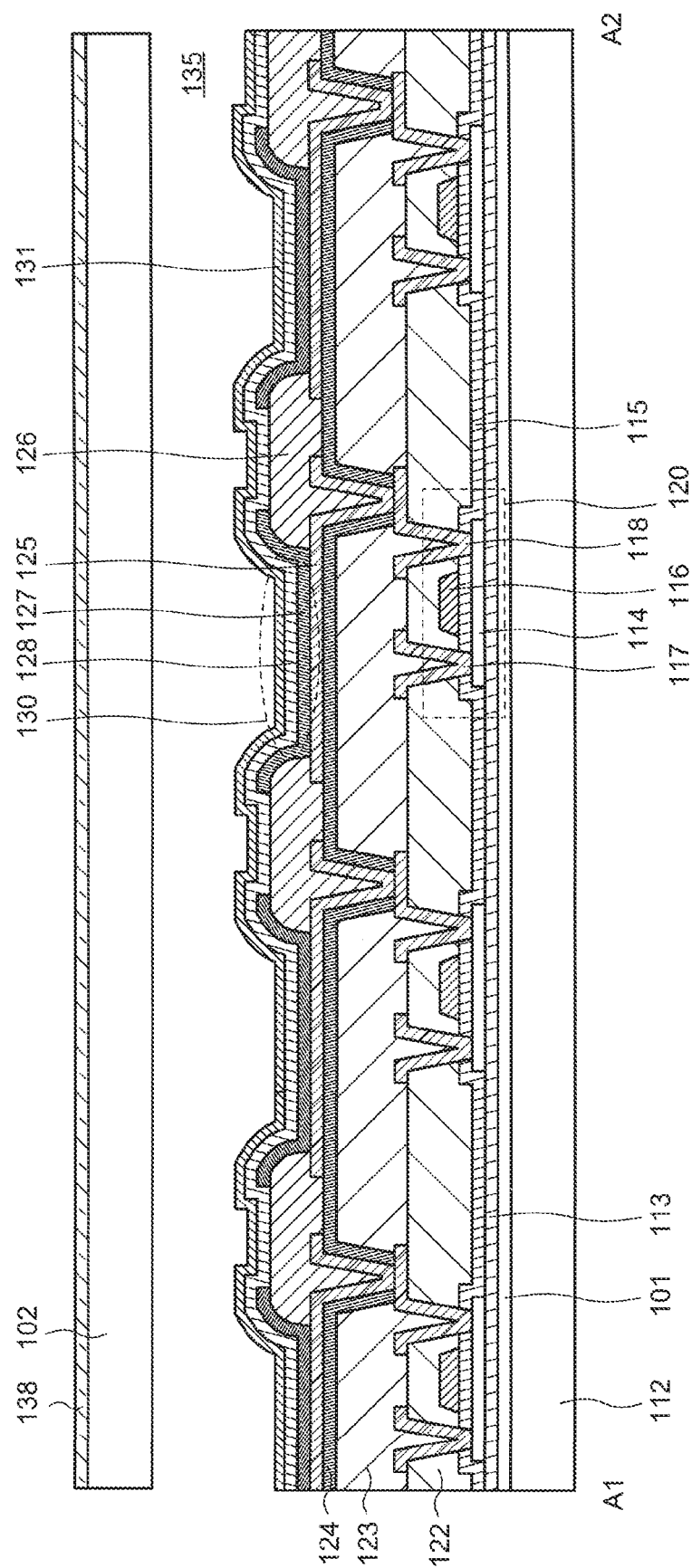
FIG. 2 is a cross-sectional view taken along the line A1-A2 in FIG. 1.

FIG. 2 is a diagram showing an example of a pixel structure in the display device 100 according to the first embodiment. Specifically, FIG. 2 shows a structure is shown of a cross section corresponding to A1-A2 of the display region 103 shown in FIG. 1. FIG. 2 shows a cross section of three light emitting elements 130 as a part of the display region 103. Although three light emitting elements 130 are exemplified in FIG. 2, actually, in the display region 103, several million or more light emitting elements are arranged in a matrix corresponding to the pixels.

As shown in FIG. 2, the display device 100 includes a first substrate 101, a second substrate 112, and a counter substrate 102. A glass substrate, a quartz substrate, a flexible substrate (polyimide, polyethylene terephthalate, polyethylene naphthalate, other flexible resin substrate) can be used as the first substrate 101, the second substrate 112 and the counter substrate 102. In the case when it is not necessary for the first substrate 101, the second substrate 112 and the counter substrate 102 to have translucency, it is also possible to use a metal substrate, a ceramic substrate and a semiconductor substrate. In the present embodiment, an example will be explained in which the material of the first substrate 101 is polyimide and the material pf the second substrate 112 and the counter substrate 102 are polyethylene terephthalate. Since the second substrate 112 is arranged provided on the rear surface of the first substrate 101 (surface on the opposite side to the side on which the terminal 107 is located), the second substrate 112 is also called a protective film or a protective resin film.

An underlayer film 113 is arranged above the first substrate 101. The underlayer film 113 is an insulating layer formed from an inorganic material such as silicon oxide, silicon nitride and aluminum oxide or the like. The underlayer film 113 is not limited to a single layer and may have a stacked structure in which, a silicon oxide layer and a silicon nitride layer are combined for example. The underlayer film 113 may be appropriately determined considering adhesion to the first substrate 101, and gas barrier properties with respect to the transistor 120 described later.

A transistor 120 is arranged above the underlayer film 113. The structure of the transistor 120 may be a top gate type or a bottom gate type structure. In the present embodiment, the transistor 120 includes a semiconductor layer 114 arranged above the underlayer film 113, a gate insulating film 115 covering the semiconductor layer 114, and a gate electrode 116 arranged above the gate insulating film 115. In addition, an interlayer insulating film 122 is arranged above the gate electrode 116. A source electrode or drain electrode 117 and a source electrode or drain electrode 118 is arranged above the interlayer insulating film 122. A source electrode or drain electrode 117 and a source electrode or drain electrode 118 is electrically connected to the transistor 120. Furthermore, in the present embodiment, although the interlayer insulating film 122 is explained as having a single layer structure as an example, the interlayer insulating film 122 may also have a stacked structure.

The material of each layer forming the transistor 120 may be any known material and is not particularly limited. For example, generally, polysilicon, amorphous silicon, or an oxide semiconductor can be used as the semiconductor layer 114. Silicon oxide or silicon nitride can be used as the gate insulating film 115. The gate electrode 116 is formed from a metal material such as copper, molybdenum, tantalum, tungsten or aluminum. Silicon oxide or silicon nitride can be used as the interlayer insulating film 122. The source electrode or drain electrode 117 and the source electrode or drain electrode 118 are each made of a metal material such as copper, titanium, molybdenum or aluminum.

Although not shown in FIG. 2, it is possible to arrange a first wiring formed from the same metal material as the metal material forming the gate electrode 116 in the same layer as the gate electrode 116. The first wiring can be arranged as, for example, a scanning line driven by the scanning line driving circuit 104 or the like. In addition, although not shown in FIG. 2, it is possible to arrange a second wiring extending in a direction intersecting the first wiring in the same layer as the source electrode or drain electrode 117 and the source electrode or drain electrode 118. For example, the wiring can be arranged as a data line or the like driven by the data line driving circuit 105.

A planarization film 123 is arranged above the transistor 120. The planarization film 123 is formed including an organic resin material. For example, a known organic resin material such as polyimide, polyamide, acrylic or epoxy and the like can be used as the organic resin material. These materials are capable of forming a film by a solution coating method and have a feature of highly flattening effects. Although not specifically shown in the diagram, the planarization film 123 is not limited to a single layer structure and may also have a stacked structure of a layer containing organic resin materials and inorganic insulating layers.

The planarization film 123 includes a contact hole which exposes a part of the source electrode or drain electrode 118. The contact hole is an opening part for electrically connecting a pixel electrode 125 described later and the source electrode or drain electrode 118. Therefore, the contact hole is arranged overlapping a part of the source electrode or the drain electrode 118. The source electrode or drain electrode 118 is exposed at the bottom surface of the contact hole.

A protective film 124 is arranged above the planarization film 123. A protection film 124 includes a contact hole overlapping the contact hole formed in the planarization layer 123 and exposing a part of the source electrode or drain electrode 118 in the contact hole. The protective film 124 is preferably an inorganic insulating material or a material having barrier properties against a moisture or oxygen, and is formed using a silicon nitride film for example.

A pixel electrode 125 is arranged above the protective film 124. The pixel electrode 125 overlaps the contact hole of the planarization film 123 and the protection film 124 and is electrically connected to the source electrode or drain electrode 118 exposed at the bottom surface of the contact hole. In the display device 100 of the present embodiment, the pixel electrode 125 functions as an anode which forms a light emitting element 130. The pixel electrode 125 has a different structure depending on whether it is a top emission type or a bottom emission type. For example, in the case of the top emission type structure, a metal film (for example, silver) having a high reflectance is used as the pixel electrode 125, or a stacked structure of a transparent conductive film with a high work function such as an indium oxide type transparent conductive film (for example, ITO) or a zinc oxide type transparent conductive film (for example, IZO, ZnO) and a metal film is used. In the case of a bottom emission type structure, the transparent conductive film described above is used as the pixel electrode 125. In the present embodiment, a top emission type organic EL display device is explained as an example. An end part of the pixel electrode 125 is covered by a first insulating layer 126 described later.

For example, a first insulating layer 126 formed from an organic resin material is arranged above the pixel electrode 125. A known resin material such as polyimide, polyimide, acrylic, epoxy or siloxane can be used as the organic resin material. The first insulating layer 126 has an opening part in a part of the pixel electrode 125. The first insulating layer 126 is arranged to cover an end part (edge part) of the pixel electrode 125 between mutually adjacent pixel electrodes 125, and functions as a member that divides adjacent pixel electrodes 125. That is, the first insulating layer 126 is divided into a plurality of pixels 109. As a result, the first insulating layer 126 is also generally called a "partition wall" or a "bank". A part of the pixel electrode 125 exposed from the first insulating layer 126 serves as a light emitting region of the light emitting element 130. It is preferred that an inner wall of the opening part of the first insulating layer 126 has a tapered shape. This makes it possible to reduce coverage defects at an end part of the pixel electrode 125 when forming a light emitting layer described later. The first insulating layer 126 may not only cover the end part of the pixel electrode 125 but may also function as a filling material filling a concave part caused by the contact hole of the planarization film 123 and the protective film 124.

An organic layer 127 is arranged above the pixel electrode 125. The organic layer 127 has at least a light emitting layer formed from an organic material and functions as a light emitting part of the light emitting element 130. In addition to the light emitting layer, the organic layer 127 may include various layers such as an electron injection layer, an electron transport layer, a hole injection layer and a hole transport layer. The organic layer 127 is arranged to cover the light emitting region, that is, to cover an opening part of the first insulating layer 126 in a light emitting region.

Furthermore, in the present embodiment, by arranging a light emitting layer which emits light of a desired color in the organic layer 127 and forming the organic layer 127 having different light emitting layers above each pixel electrode 125, it is possible to display each color of RGB. That is, in the present embodiment, the organic layer 127 is discontinuous between adjacent pixels 109, in other words, between adjacent pixel electrodes 125. A known structure or a known material can be used for the organic layer 127, and is not particularly limited to the structure of the present embodiment. In addition, the organic layer 127 has a light emitting layer that emits white light, and each color of RGB may be displayed through a color filter. In this case, the organic layer 127 may be arranged to cover the first insulating layer 126 and across a plurality of pixels 109.

A counter electrode 128 is arranged above the organic layer 127 and the first insulating layer 126. The counter electrode 128 functions as a cathode which forms the light emitting element 130. Since the display device 100 of the present embodiment is a top emission type, a transparent electrode is used as the counter electrode 128. An MgAg thin film or a transparent conductive film (ITO or IZO) is used as the thin film forming the transparent electrode. The counter electrode 128 is also arranged above the first insulating layer 126 and across each pixel 109. The counter electrode 128 is electrically connected to an external terminal via a conductive layer on a lower layer on the outer side of the display region 103 and in a periphery region in the vicinity of an end of the display region 103. As described above, in the present embodiment, the light emitting element 130 is formed by a part (anode) of the pixel electrode 125, the organic layer 127 (light emitting part) and the counter electrode 128 (cathode) exposed from the first insulating layer 126.

A first inorganic insulating layer 131 is arranged above the counter electrode 128. The first inorganic insulating layer 131 covers a plurality of light emitting elements 130 and protects the light emitting element 130 from external moisture and external air and the like. Therefore, the first inorganic insulating layer 131 is also called a sealing film. It is preferred to use an inorganic insulating film having highly density such as a silicon nitride film as the first inorganic insulating layer 131. Furthermore, the sealing film may have a stacked structure of an inorganic insulating film and an organic insulating film. As is described later, a three-layer structure is possible in which an organic insulating film is arranged above the first inorganic insulating layer 131 and an inorganic insulating film is further arranged above the organic insulating film.

From the second substrate 112 to the first inorganic insulating layer 131 (sealing film) explained above are collectively referred to as an array substrate in the present embodiment.

The counter substrate 102 is arranged via a filler 135 (also referred to as a filler material) functioning as an adhesive and a protective material above the array substrate. A known resin material of polyimide type, polyamide type, acrylic type, epoxy type or siloxane type can be used as the filler 135. In particular, in the case when the counter substrate 102 is a resin substrate (resin film), a known adhesive having translucency is used for the filler 135. A spacer may also be arranged in the filler 135 in order to secure a gap between the array substrate and the counter substrate 102. Such a spacer may be mixed with the filler 135 or may be formed using a resin or the like above the array substrate. In addition, a structure which does not use the filler 135 is also possible as long as it is possible to realize sufficient sealing at a periphery part of the substrate between the array substrate and the counter substrate 102, bonding between the array substrate and the counter substrate 102, and gap retention. In a structure which does not use the filler 135, an annular substrate bonding member (also called a sealing material) may be arranged at the substrate periphery part between the array substrate and the counter substrate 102. For example, an organic resin or frit glass is used as the substrate bonding member. In addition, in a structure which does not use the filler 135, an inert gas (for example, nitrogen) may be filled into sections where the filler 135 is located in FIG. 2.

For example, an overcoat layer may be arranged on the counter substrate 102 for flattening. In the case when the organic layer 127 emits white light, a color filter corresponding to each color of RGB and a black matrix between color filters may be arranged on a main surface (surface facing the first substrate 101) of the counter substrate 102. The counter substrate 102 is not an essential element of the display device 100, the filler 135 has sufficient film thickness and strength so that if it is possible to suitably protect a layer below the sealing film from contact with external foreign matter or the like, then the counter substrate 102 can be omitted. In the case when the counter substrate 102 is omitted and a color filter is necessary, for example, a color filter may be directly formed on a sealing film or the like and the filler 135 may be formed thereon. In addition, a polarization plate 138 is arranged on a rear surface (display surface side) of the counter substrate 102. The polarization plate 138 is a circularly polarization plate for example. The counter substrate 102 may be omitted and a circularly polarization plate may be attached to the array substrate via an adhesive. In other words, the counter substrate 102 may be a circularly polarization plate.

Figure 3:
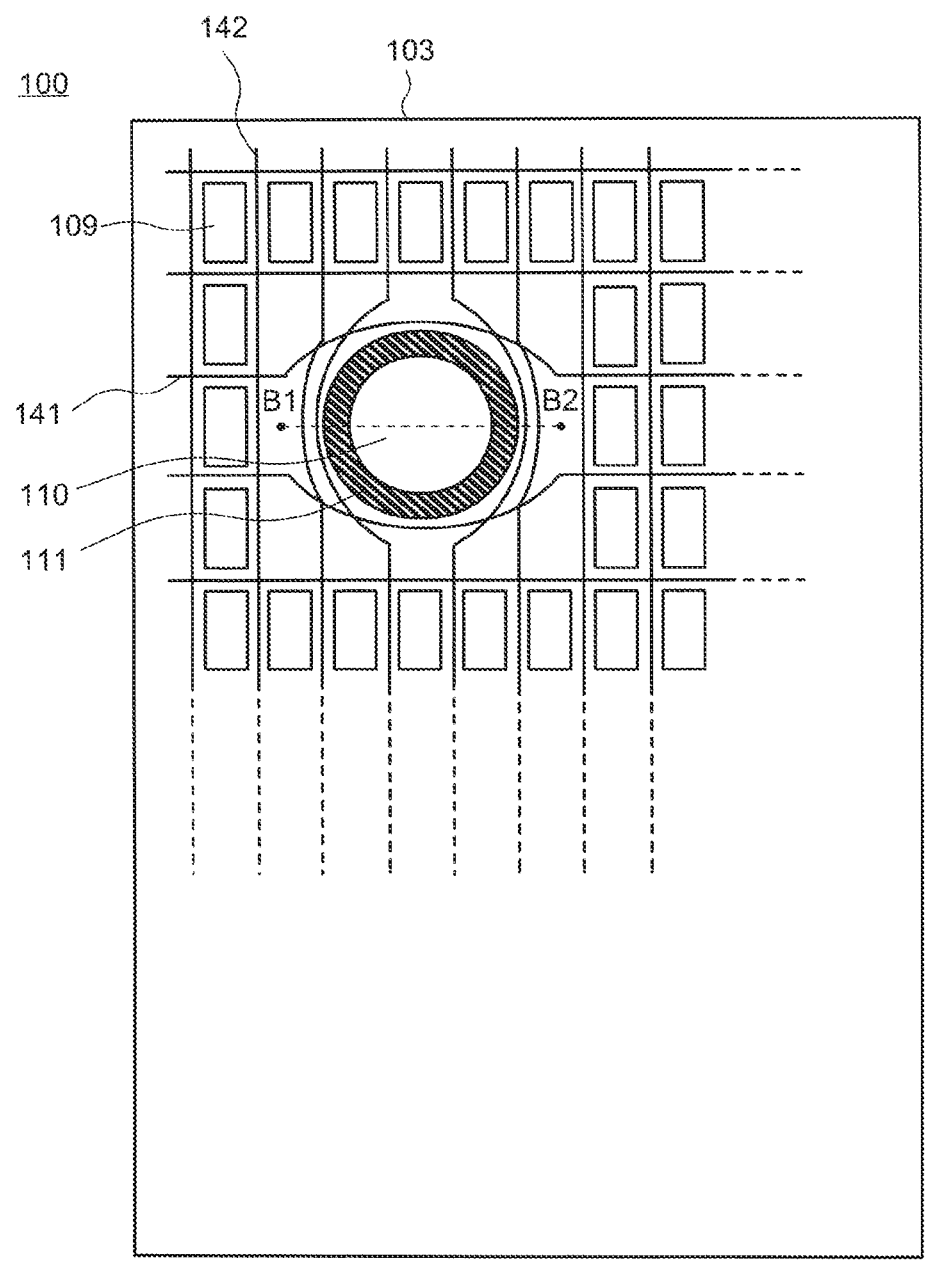
FIG. 3 is a diagram showing a display region of a display device related to one embodiment of the present invention.

A structure in which a through hole 110 passing through the array substrate and the counter substrate 102 arranged in the display region 103 of the display device 100 is shown in FIG. 3. A plurality of pixels 109, a through hole 110 and a moisture blocking region 111 are shown in FIG. 3.

As shown in FIG. 3, the display region 103 includes a plurality of pixels 109, a plurality of scanning lines 141, a plurality of data lines 142, a through hole 110 and a moisture blocking region 111 (also called a region surrounding the through hole 110). The scanning line 141 is electrically connected to a pixel circuit arranged in a pixel 109. The data line 142 intersects the scanning line 141 and is electrically connected to a pixel circuit arranged in a pixel 109.

In addition, as shown in FIG. 3, the scanning line 141 bypasses the through hole 110 and the moisture blocking region 111 and is connected to a pixel circuit arranged in each of the pixels 109 on both sides facing the through hole 110. In addition, the data line 142 also bypasses the through hole 110 and the moisture blocking region 111 and is connected to a pixel circuit arranged in each upper and lower pixel 109 facing the through hole 110. In this way, an image signal can be normally output even in the case where the through hole 110 passing through the array substrate and the counter substrate is arranged in the display region 103. Furthermore, although a structure is shown in FIG. 3 in which the scanning line 141 and the data line 142 do not overlap the moisture blocking region 111, the present invention is not limited to this structure. A structure is also possible in which the scanning line 141 and the data line 142 overlap the moisture blocking region 111. In addition, although an example in which one through hole 110 is arranged the display region 103 shown in FIG. 3, a plurality of through holes 110 may also be arranged. In addition, in the case where a plurality of through holes 110 are arranged, the size of each through hole 110 may be different. Although an example is shown in which the through hole 110 and the moisture blocking region 111 are formed in a circular shape, they may also have a polygonal shape.

Figure 4:
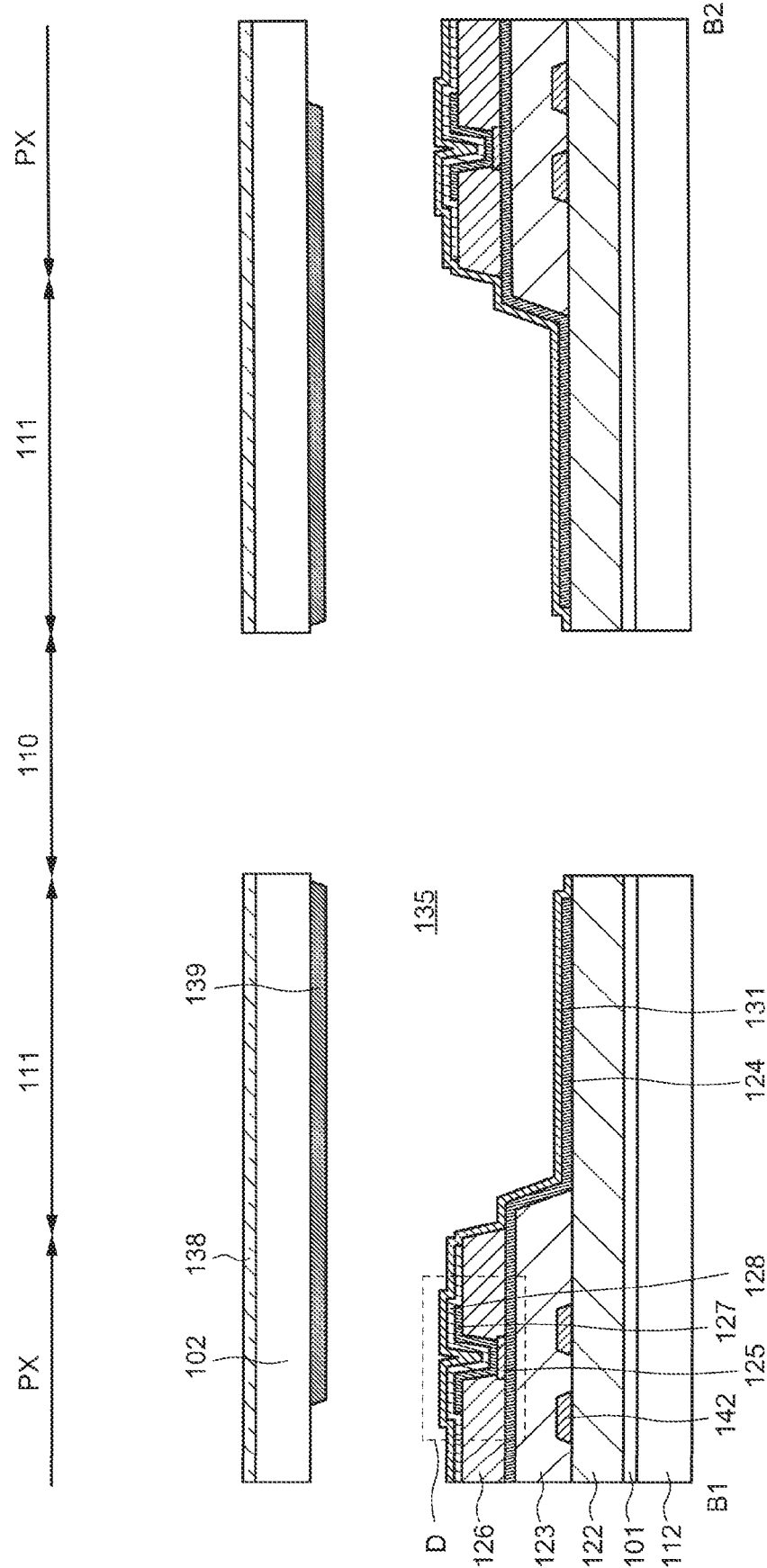
FIG. 4 is a cross-sectional view showing a structure of a display device related to one embodiment of the present invention.

FIG. 4 shows a cross-sectional view along the line B1-B2 shown in FIG. 3. Furthermore, although the width of the through hole 110 is shown to be narrower than the width of the moisture blocking region 111 for the sake of explanation in the cross-sectional view of FIG. 4, actually the width of the through hole 110 is wider than the width of the moisture blocking region 111.

In FIG. 4, a data line 142 bypassing a through hole 110 is arranged above the interlayer insulating film 122. The data line 142 is formed in the same layer as the source electrodes or drain electrodes 117 and 118 shown in FIG. 2, for example. A planarization film 123 is arranged above the interlayer insulating film 122. In a region PX in which a pixel 109 is formed, a protective film 124 is arranged above the planarization film 123. A protective film 124 is contact with an end part the planarization film 123 (an upper surface and side surface of the planarization film 123) in the moisture blocking region 111. The protective film 124 is preferred to have barrier properties against moisture.

As described above, the pixel electrode 125, first insulating layer 126, organic layer 127 and the counter electrode 128 are arranged in the region PX where a pixel 109 is formed. The pixel electrode 125, the organic layer 127, and the counter electrode 128 form a light emitting element 130. A first inorganic insulating layer 131 is arranged above the light emitting element 130. In addition, the first inorganic insulating layer 131 is arranged in contact with the protective film 124 above the interlayer insulating film 122. In addition, the first inorganic insulating layer 131 is arranged in contact with an end part of the protective film 124. The first inorganic insulating layer 131 functions as a sealing film of the light emitting element 130.

A dummy pixel D may be arranged between the pixel 109 and the through hole 110. The dummy pixel D shown in FIG. 4 includes a pixel electrode 125, an organic layer 127 and a counter electrode 128. It is not absolutely necessary that the dummy pixel D have a function for emitting light and is not required to have the same structure as the pixel 109 and the light emitting element 130. For example, by arranging the dummy pixel D between the pixel 109 and the through hole 110, in the manufacturing process after the arrangement of the through hole 110, it is possible to obtain an effect of preventing a pixel circuit arranged in a pixel 109 from being damaged by static electricity the side surface of the through hole 110, that is, from the end surface of the array substrate exposed by the through hole 110.

The array substrate having the structure described above and the counter substrate 102 are bonded together via the filler 135. Furthermore, as shown in FIG. 4, the counter substrate 102 may be arranged with a light shielding layer 139 on the side facing the light emitting element 130 in the moisture blocking region 111. A polarization plate 138 is arranged on the display surface side of the counter substrate 102.

The through hole 110 is a hole which passes through the array substrate and the counter substrate 102. In addition, as shown in FIG. 4, the polarization plate 138 also has an opening part at a position where the through hole 110 is arranged.

When an organic EL element included in the organic EL display device is exposed to air, moisture and oxygen in the air cause deterioration of a light emitting layer including an organic EL material and a cathode, and thus leads to a decrease in the performance of the device. As is disclosed in Japanese Laid Open Patent Publication No. 2014-235790, in the case of forming a through hole passing through a display panel, moisture or oxygen enters from a region where the through hole is formed which causes an organic EL element to deteriorate leading to a problem whereby the reliability of the organic EL display device decreases.

As shown in FIG. 4, a structure is adopted in which the moisture blocking region 111 is arranged so as to enclose the through hole 110 passing through the array substrate and the counter substrate 102 in the display region 103. In this way, an end part of the planarization film 123 and an end part of the first insulating layer 126 which can become a pathway for the entrance of moisture or oxygen, can be sealed by the protective film 124 having a barrier function against moisture and oxygen. In addition, a first inorganic insulating layer 131 (sealing film) having barrier properties against moisture and oxygen is arranged above the light emitting element 130. By adopting a structure in which the first inorganic insulating layer 131 extends up to the moisture blocking region 111, and the protective film 124 and the first inorganic insulating layer 131 are in contact with each other in the moisture blocking region 111, it is possible to prevent moisture and oxygen from entering from the through hole 110. In other words, in the moisture blocking region 111, that is, in a region between the through hole 110 and a pixel 109, by not arranging a layer formed of an organic material in a stacked structure in which various layers formed above the first substrate 101 are stacked, it is possible to prevent moisture and oxygen from entering from the through hole 110. In this way, it is possible to prevent deterioration of a light emitting element, and thereby reliability of the display device can be improved. In addition, it is possible to provide a display device with improved design properties by arranging the through hole 110.

Figure 5:
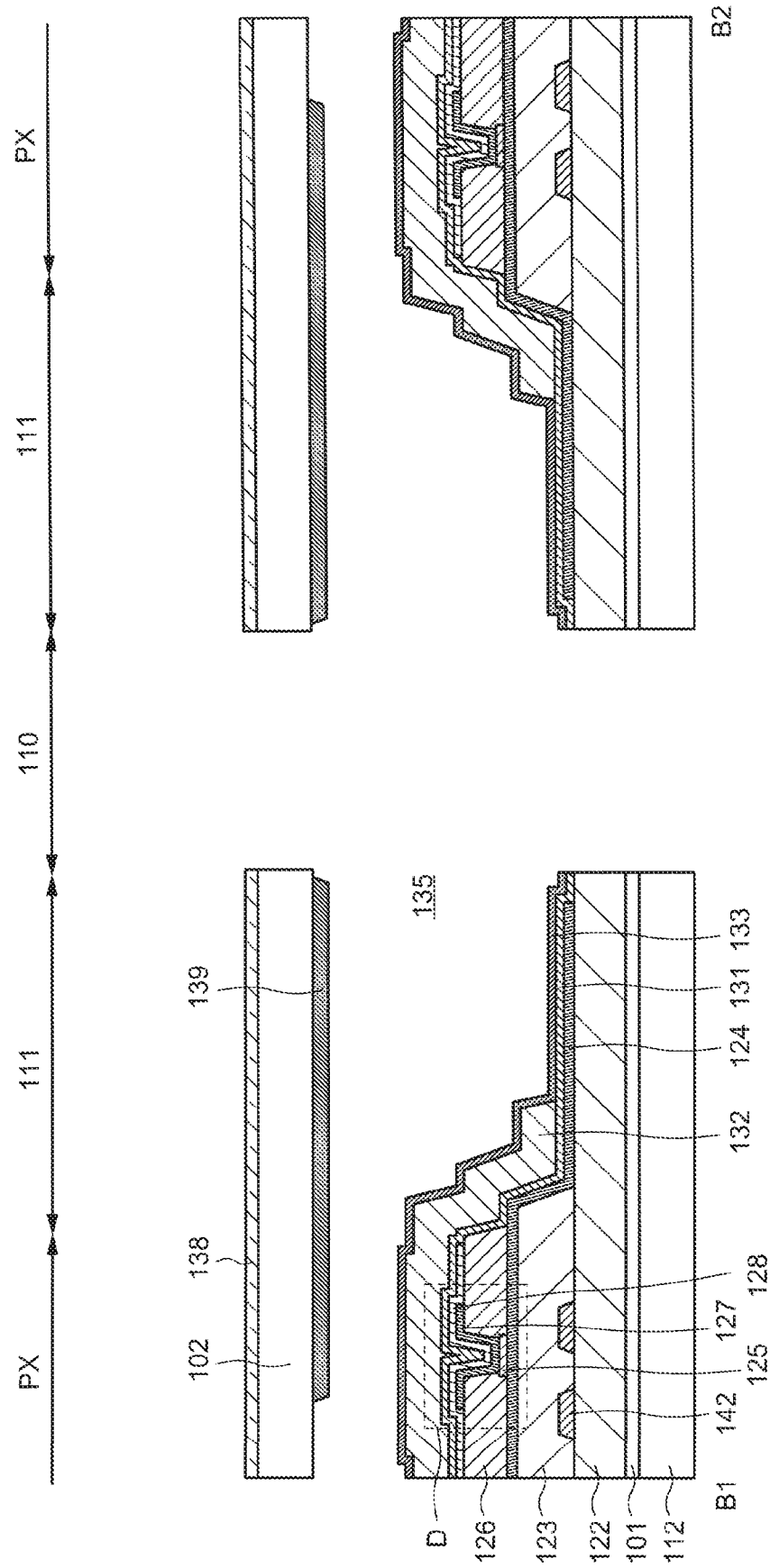
FIG. 5 is a cross-sectional view showing a structure of a display device related to one embodiment of the present invention.

An example of a display device partially different from FIG. 4 is shown in FIG. 5. In the display device shown in FIG. 5, the structure of the sealing film arranged above the light emitting element 130 is partially different from the structure of the sealing film arranged above the light emitting element 130 shown in FIG. 4. Since the other structures are the same as those of the display device shown in FIG. 4, a detailed explanation is omitted.

As shown in FIG. 5, a first inorganic insulating layer 131, organic insulating layer 132, and a second inorganic insulating layer 133 are arranged above the light emitting element 130. The first inorganic insulating layer 131, the organic insulating layer 132 and the second inorganic insulating layer 133 function as a sealing film of the light emitting element 130. Since it is possible to prevent moisture and oxygen from entering the light emitting element 130 by arranging a sealing film above the light emitting element 130, deterioration of the light emitting element 130 due to moisture or oxygen can be prevented. The organic insulating layer 132 includes an organic resin material. For example, a known organic resin material such as polyimide, polyamide, acrylic or epoxy can be used as the organic resin material. In addition, the second inorganic insulating layer 133 is preferably a high density film which can prevent moisture and oxygen from entering. For example, it is preferred to use a silicon nitride film as the second inorganic insulating layer 133.

As shown in FIG. 5, the organic insulating layer 132 is arranged to cover an end part of the first insulating layer 126 and an end part of the planarization film 123 with the first inorganic insulating layer 131 interposed therebetween. In addition, the second inorganic insulating layer 133 is arranged to cover an upper surface and an end part of the organic insulating layer 132, and is arranged to contact the first inorganic insulating layer 131.

As shown in FIG. 5, by arranging the first inorganic insulating layer 131, the organic insulating layer 132 and the second inorganic insulating layer 133 as a sealing film above the light emitting element 130, it is possible to prevent moisture and oxygen from entering the light emitting element 130. In addition, by adopting a structure in which the protection film 124 and the first inorganic insulating layer 131, and the first inorganic insulating layer 131 and the second inorganic insulating layer 133 are in contact with each other in the moisture blocking region 111, it is possible to prevent moisture and oxygen from entering the light emitting element 130. In particular, a structure in which the first inorganic insulating layer 131 and the second inorganic insulating layer 133 are directly in contact at an end part of the through hole 110 (region in the moisture blocking region 111 in contact with an end part of the through hole 110) without being interposed by an organic layer therebetween, has a remarkable effect of blocking moisture n from entering from the through hole 110 to the inside of the display device 100. In addition, it is possible to provide a display device with improved design properties by arranging the through hole 110.

Figure 6:
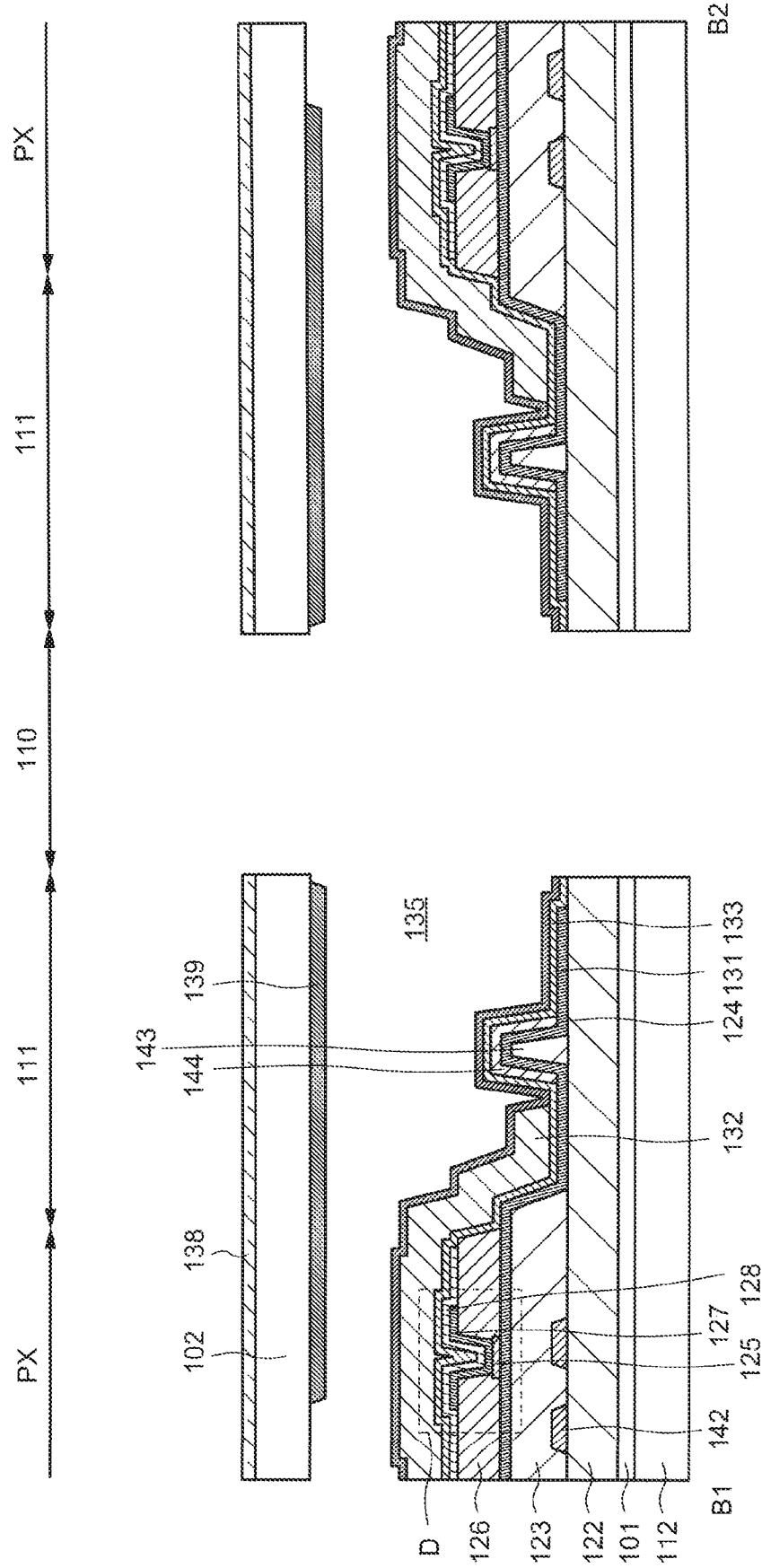
FIG. 6 is a cross-sectional view showing a structure of a display device related to one embodiment of the present invention.

An example of a display device partially different from FIG. 5 is shown in FIG. 6. In the display device shown in FIG. 6, the structure of the moisture blocking region 111 is partially different from that of the moisture blocking region 111 shown in FIG. 5. Since the other structures are the same as those of the display device shown in FIG. 5, a detailed explanation is omitted.

As shown in FIG. 6, a convex part 143 is arranged above the interlayer insulating film 122 in the moisture blocking region 111. In a planar view, a plurality of convex parts 143 are arranged along an outer periphery of the through hole 110. One convex part 143 may be provided annularly along the outer periphery of the through hole 110. In addition, the convex part 143 is formed from the same organic insulating material as the organic insulating material forming the planarization film 123. In addition, a protective film 124 is arranged to cover the planarization film 123 and the convex part 143. The protective film 124 is arranged in contact with an end part of the planarization film 123. In addition, in the convex part 143, a convex part 144 is arranged via the protective film 124. The convex part 144 is made of the same organic insulating material as the first insulating layer 126. In addition, the convex part 144 has a shape conforming to the shape of the convex part 143. In addition, the first inorganic insulating layer 131 is arranged in contact with an end part of the protective film 124. In addition, the first inorganic insulating layer 131 is in contact with the upper surface of the protective film 124 in a region where the convex part 143 is not formed. In addition, the first inorganic insulating layer 131 and the second inorganic insulating layer 133 are arranged to be in contact with each other in the moisture blocking region 111. Furthermore, a structure is also possible where the convex part 144 is not arranged.

As shown in FIG. 6, by arranging the convex part 143 and the convex part 144 in the moisture blocking region 111, it is possible to increase the region where the first inorganic insulating layer 131 and the second inorganic insulating layer 133 are in contact with each other. In this way, moisture and oxygen are further prevented from entering the light emitting element 130. In addition, by arranging the through hole 110, it is possible to provide a display device with improved design properties.

Figure 7:
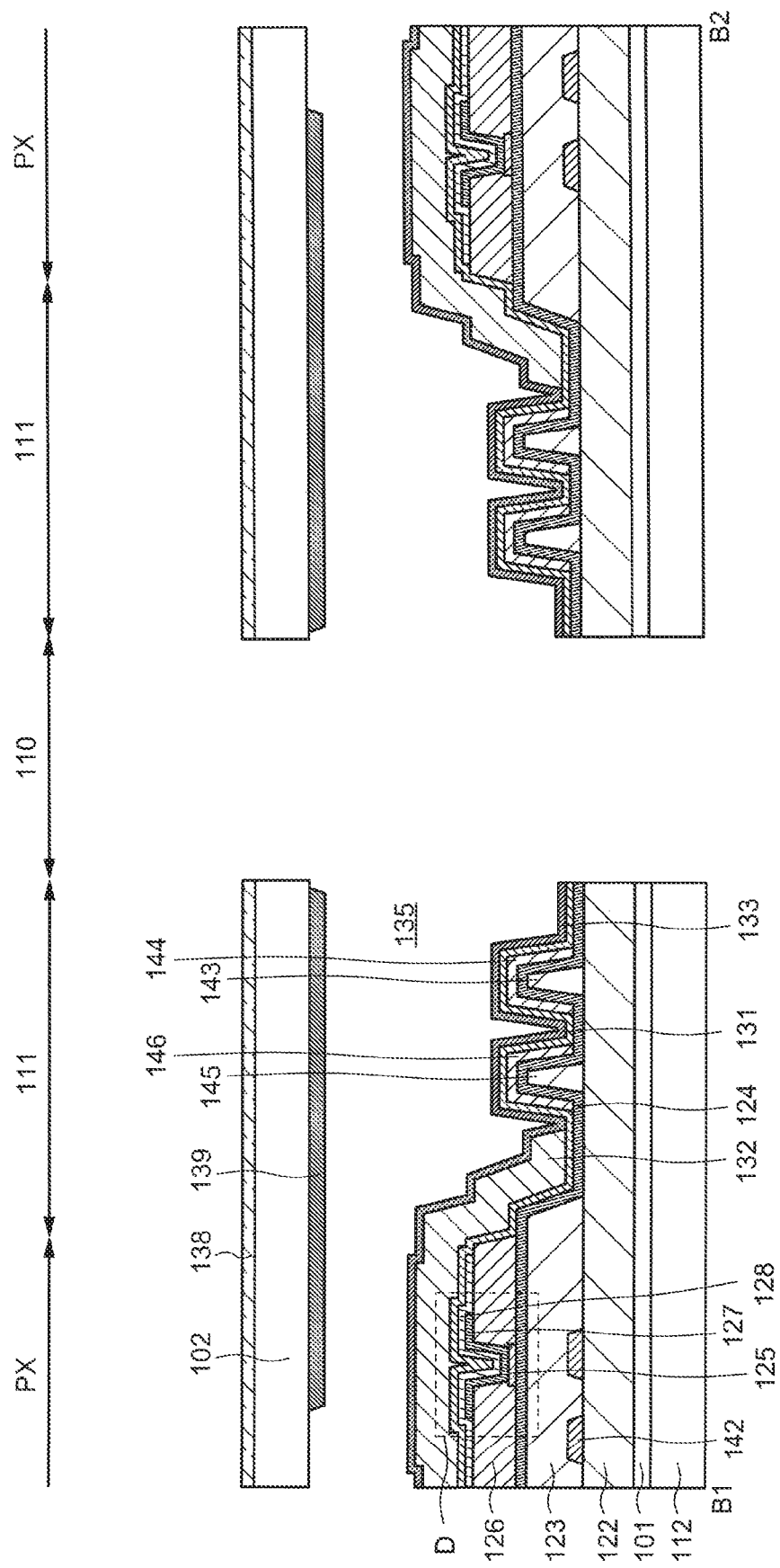
FIG. 7 is a cross-sectional view showing a structure of a display device related to one embodiment of the present invention.

As shown in FIG. 7, a structure is possible in which a plurality of convex parts are arranged in the moisture blocking region 111. That is, in the structure of the convex part shown in FIG. 7, a plurality of convex parts 143 are arranged along the outer periphery of the through hole 110 in a planar view, and furthermore, a plurality of convex parts 145 are arranged to surround the plurality of convex parts 143. A convex part 146 may also be arranged above the convex part 145 similar to the positional relationship and structure between the convex part 143 and the convex part 144. One convex part 143 and one convex part 145 may be arranged annularly along the outer periphery of the through hole 110. By arranging a plurality of convex parts formed from the same material as the planarization film 123 in the moisture blocking region 11 it is possible to increase the region where the first inorganic insulating layer 131 and the second inorganic insulating layer 133 are in contact with each other. In this way, moisture and oxygen can be further prevented from entering into the light emitting element. In addition, by arranging the through hole 110, it is possible to provide a display device with improved design properties.

[Manufacturing Method 1]

Figure 8:
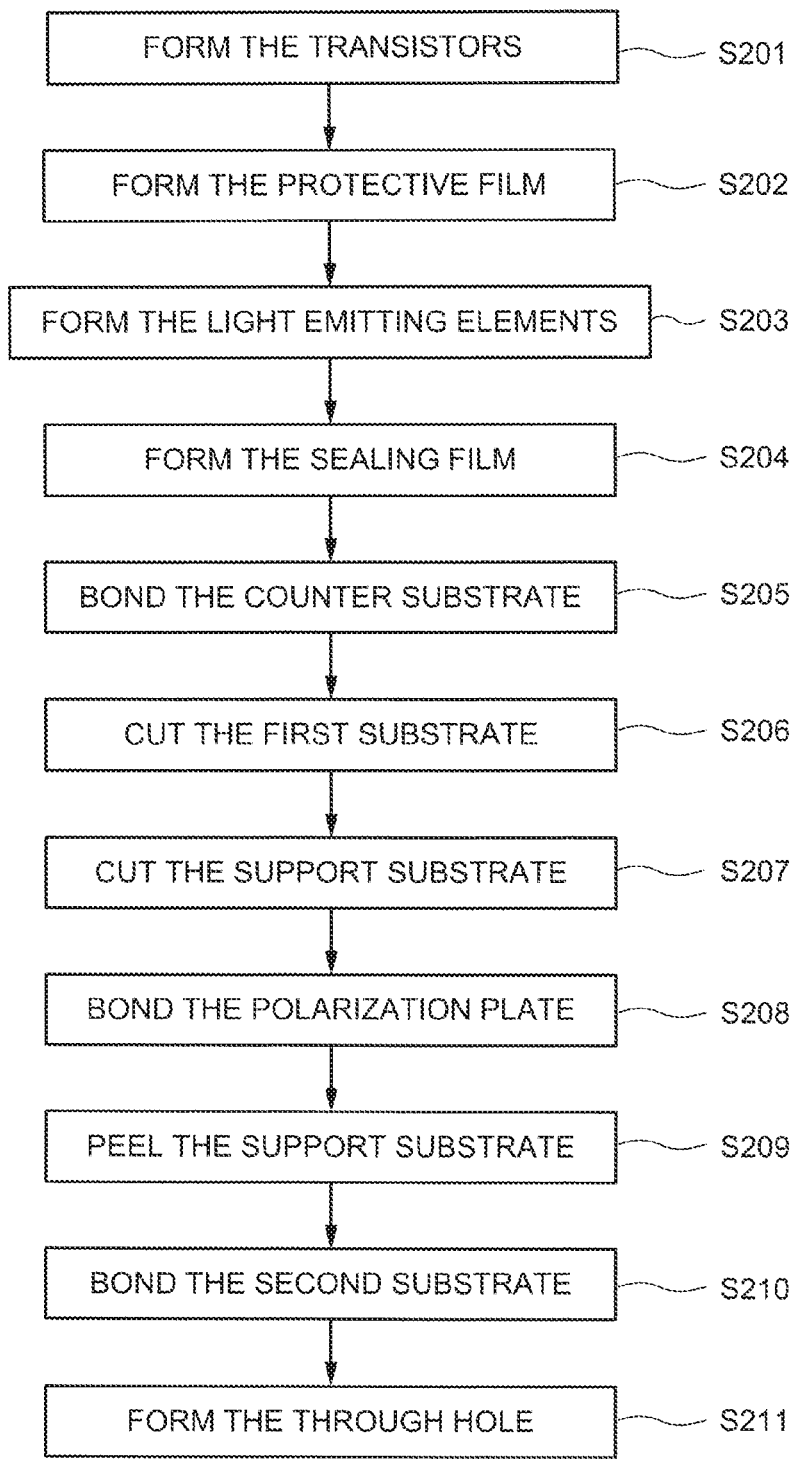
FIG. 8 is a diagram for explaining a manufacturing process of a display device related to one embodiment of the present invention.

Next, a manufacturing method of the display device 100 is explained referring to FIG. 8. FIG. 8 is a process flow for explaining the manufacturing method of the display device 100 according to the present embodiment. Furthermore, with respect to the process flow shown in FIG. 8, the reference numerals in FIG. 2 are used for the explanation of the pixels 109, and the reference numerals in FIG. 6 are used for the through hole 110 and moisture blocking region 111.

First, a transistor 120 is formed over a first substrate 101 formed on a supporting substrate (not shown in the diagram) (step S201). In the present embodiment, a case is explained where a glass substrate is used as the supporting substrate and polyimide is used as the first substrate 101. Next, an interlayer insulating film 122, a source electrode or drain electrode 118 connected via an opening of the interlayer insulating film 122 are formed above the transistor 120. Next, a planarization film 123 is formed above the interlayer insulating film 122 and the source electrode or drain electrode 118. After that, the planarization film 123 is processed so that an opening part is formed in the planarization film 123 in a region where the through hole 110 is formed, and a convex part 143 is formed in the moisture blocking region 111.

Next, a protective film 124 is formed above the planarization film 123 and the convex part 143 (step S202). The protective film 124 is formed to cover an end of the planarization film 123 existing in the moisture blocking region 111 and cover the convex part 143. In addition, it is preferred that the interlayer insulating film 122 and the protective film 124 contact each other in the moisture blocking region 111.

Next, a light emitting element 130 is formed above the protective film 124 (step S203). The light emitting element 130 forms in order a pixel electrode 125, first insulating layer 126, organic layer 127, and a counter electrode 128. At the same time as forming the first insulating layer 126, a convex part 144 is formed above the protective film 124.

Next, a sealing film is formed above the light emitting element 130 (step S204). A first inorganic insulating layer 131, an organic insulating layer 132 and a second inorganic insulating layer 133 are formed in this order as a sealing film.

Next, the first substrate 101 on which the transistor 120 and the light emitting element 130 are formed and the counter substrate 102 are bonded together with a filler 135 interposed therebetween (step S205).

Next, the bonded first substrate 101 and counter substrate 102 are cut according to the shape of the display device or to a size larger than the shape of the display device (step S206). It is possible to use a scribe break with a scribing wheel, punch cutting, laser cutting and combinations thereof for the cutting method of step S206.

Next, the support substrate is cut (step S207). It is possible to use a scribe break with a scribing wheel, punch cutting, laser cutting and combinations thereof for the cutting method of the support substrate. Steps S206 and S207 may also be performed at the same time.

Next, the polarization plate 138 is attached to the counter substrate 102 (step S208). After this, a step of mounting a driver IC on the first substrate 101 may be included.

Next, the first substrate 101 is peeled from the support substrate by irradiating the first substrate 101 with a laser through the support substrate (step S209). The order of steps S208 and S209 may also be interchanged. That is, the polarization plate 138 may be bonded after peeling the support substrate.

Next, the second substrate 112 is bonded to the rear surface of the first substrate 101 (step S210). In the present embodiment, a case is explained where polyethylene terephthalate is used as the second substrate 112. Here, the structure from the second substrate 112 to a sealing film is called an array substrate. After this, in the case when cutting is performed to a size larger than the shape of the display device in step S206, the periphery of the array substrate and the counter substrate 102 is cut so as to adjust the exterior shape of the display device.

Next, the through hole 110 is formed in the array substrate and the counter substrate 102 (step S211). The through hole 110 is formed by a mechanical processing method using a punch or the like. In addition, the through hole 110 is formed to be located on the interior of the moisture blocking region 111. In this way, it is possible to collectively form the through hole 110 in the array substrate and the counter substrate.

The display device 100 according to this embodiment can be formed by the steps described above. According to the manufacturing method shown in FIG. 8, the through hole 110 is arranged in the display region 103 and thereby it is possible to manufacture a display device with improved design properties. In addition, even if the through hole 110 is formed, since it is possible to prevent moisture and oxygen from entering from the through hole 110 by the moisture blocking region 111, deterioration of the light emitting element can be prevented. In this way, reliability of the display device can be improved. Furthermore, since the sealing film is formed using a plasma CVD apparatus arranged with a mask in step S204 and patterning of the sealing film becomes unnecessary, that it is possible to simplify the formation process of a sealing film.

[Manufacturing Method 2]

Figure 9:
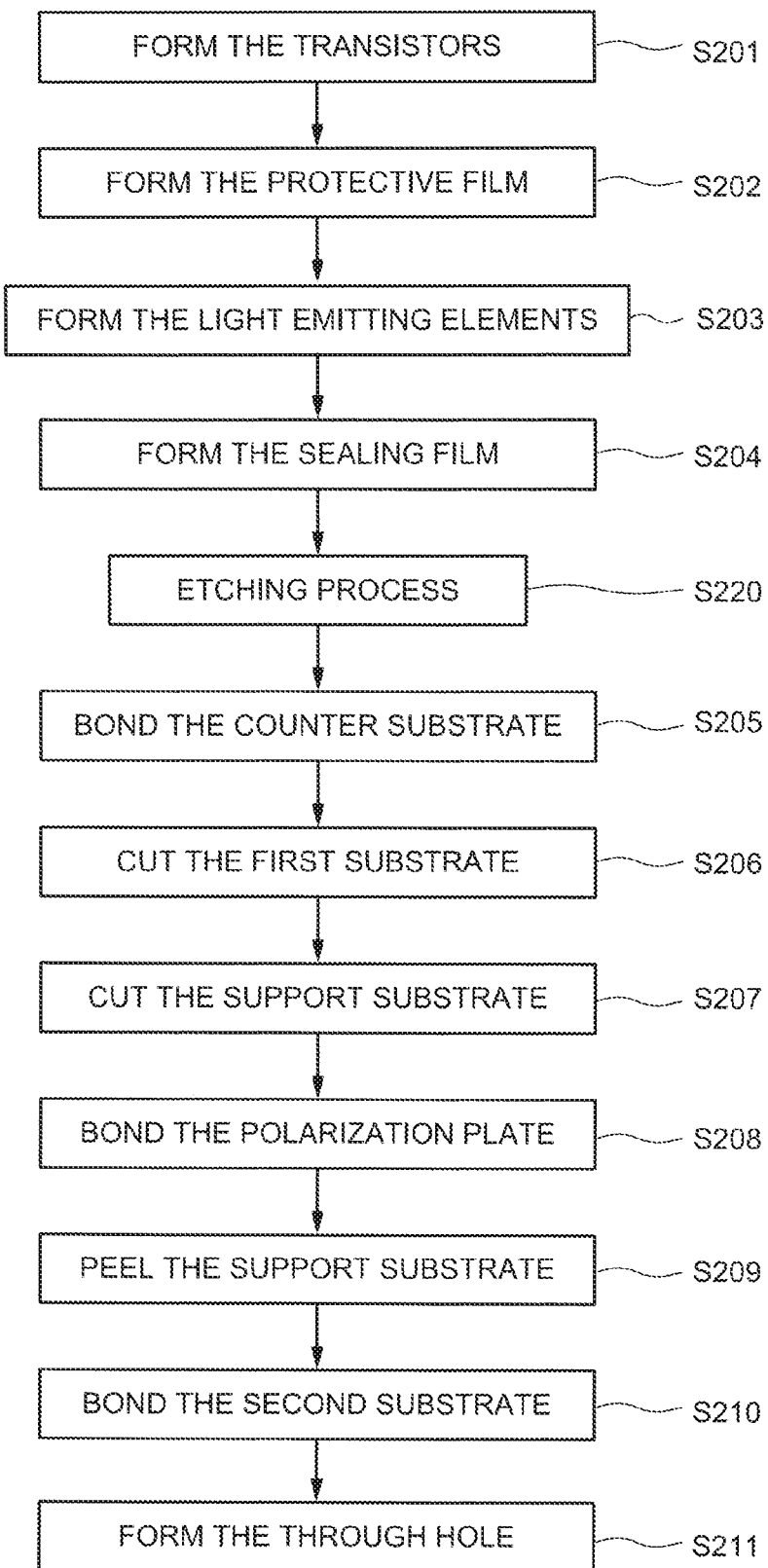
FIG. 9 is a diagram for explaining a manufacturing process of a display device related to one embodiment of the present invention.

In addition, it is possible to manufacture the display device 100 by the process flow shown in FIG. 9. Since the process flow shown in FIG. 9 is only partly different from the process flow of FIG. 8 after the formation of a sealing film, the processes after the formation of the sealing film are explained in detail and a detailed explanation of the processes similar to FIG. 8 is omitted.

In the process flow of FIG. 9, after the sealing film is formed in step S204, the region where the through hole 110 is to be subsequently formed is etched until the support substrate is exposed, that is, until the first substrate 101 which is in direct contact with the support substrate (step S220). The etching process may be dry etching or wet etching. Step S220 may be a step of etching up to the first inorganic insulating layer 131. In addition, a manufacturing method may be performed in which a sealing film is not formed in a region where the through hole 110 is formed by using a mask when a sealing film is formed instead of performing step S220. In step S220, an etching process is performed on the region where the through hole 110 is subsequently formed and the first substrate 101 and the sealing film are removed. In this way, it is possible to prevent damage to the first substrate 101 and the sealing film when forming the through hole 110 in the hole opening step of step S211. The steps after step S205 are the same as the process flow of FIG. 8. In this way, it is possible to prevent moisture and oxygen or the like from entering due to damage of the first substrate 101 and the sealing film and prevent moisture and oxygen to entering the light emitting element 130. In this way, a highly reliable display device can be provided.

SECOND EMBODIMENT

In the present embodiment, an explanation is given of a display device having a partly different structure to the display device explained in the first embodiment while referring to FIG. 10 to FIG. 14. Specifically, the structure of the moisture blocking region 111 is explained in detail. Since the other structures are the same as those of the display device explained in the first embodiment, a detailed explanation is omitted.

Figure 10:
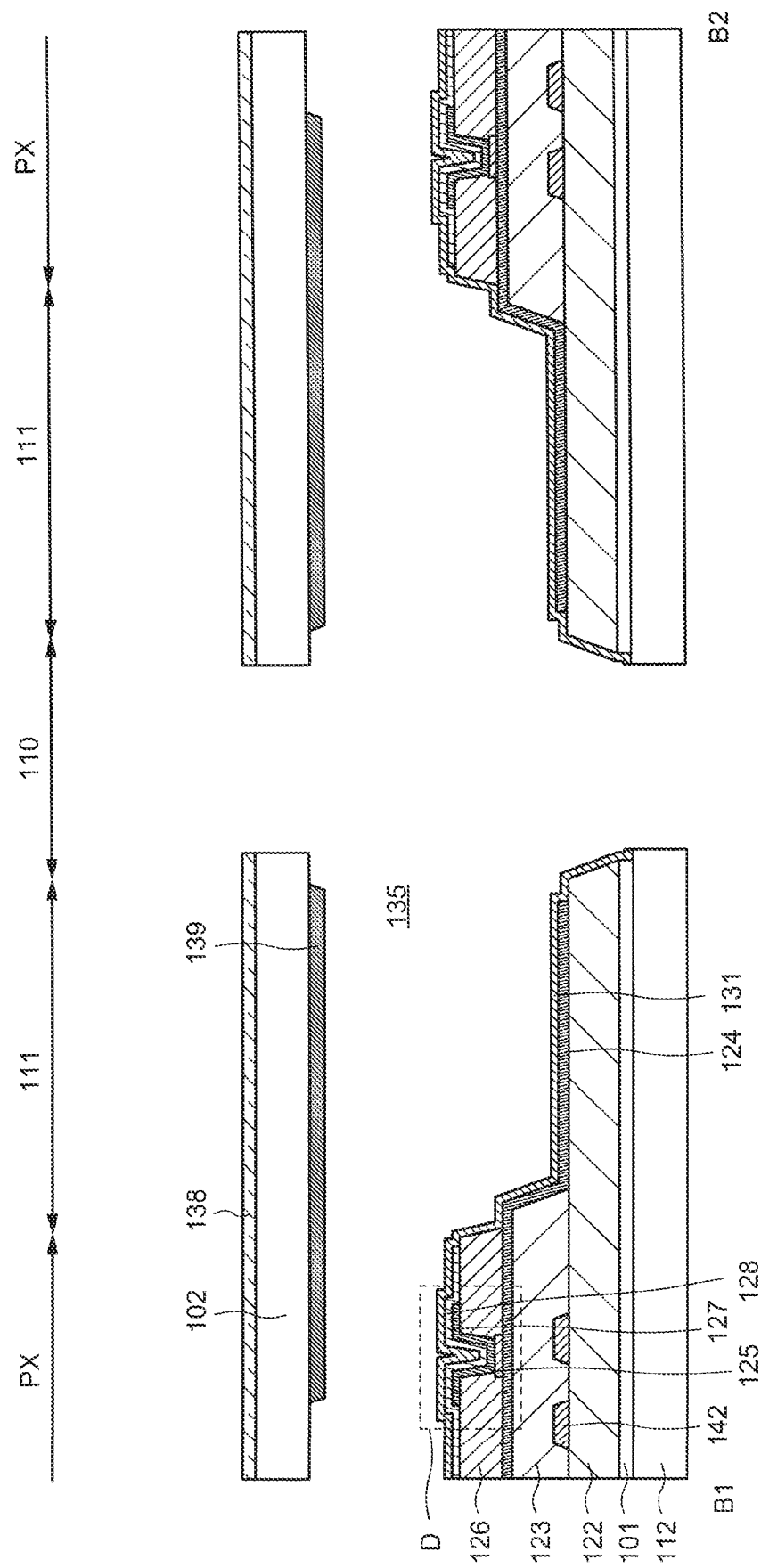
FIG. 10 is a cross-sectional view showing a structure of a display device related to one embodiment of the present invention.

The moisture blocking region 111 of the display device shown in FIG. 10 has a structure partially different from the moisture blocking region 111 of the display device shown in FIG. 4. Specifically, in the moisture blocking region 111, the first inorganic insulating layer 131 which functions as a sealing film is formed in contact with an end part of the first substrate 101, an end part of the interlayer insulating film 122, and the end part of the protective film 124. By adopting the structure shown in FIG. 10, it is possible to prevent moisture and oxygen from entering from the end part of the first substrate 101 and the end part of the interlayer insulating film 122 and thereby prevent the light emitting element 130 from deteriorating.

Figure 11:
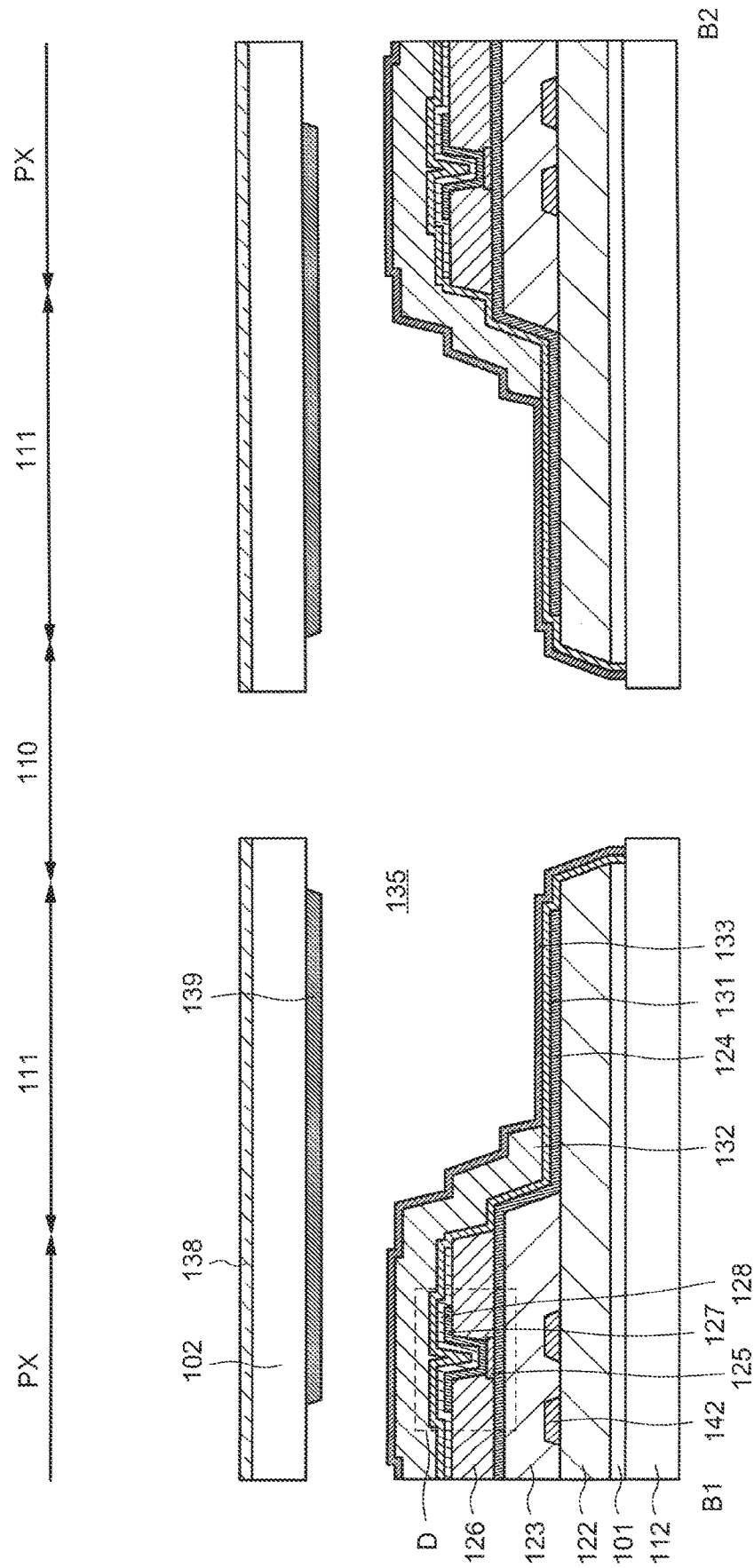
FIG. 11 is a cross-sectional view showing a structure of a display device related to one embodiment of the present invention.

Next, the moisture blocking region 111 of the display device shown in FIG. 11 has a structure partially different from the moisture blocking region 111 of the display device shown in FIG. 10. Specifically, in the moisture blocking region 111, the organic insulating layer 132 is arranged above the first inorganic insulating layer 131, and the second inorganic insulating layer 133 is arranged above the organic insulating layer 132. The first inorganic insulating layer 131 is arranged in contact with an end part of the protective film 124, an end part of the interlayer insulating film 122, and an end part of the first substrate 101. In addition, the end part of the organic insulating layer 132 is covered by the second inorganic insulating layer 133. In addition, the second inorganic insulating layer 133 is arranged in contact with the first inorganic insulating layer 131 and together with the first inorganic insulating layer 131 covers the end part of the first substrate 101, the end part of the interlayer insulating film 122, and an end part of the protective film 124. By adopting the structure shown in FIG. 11, the region where the first inorganic insulating layer 131 and the second inorganic insulating layer 133 are in contact can be increased. In addition, it is possible to prevent moisture and oxygen from entering from the end part of the first substrate 101 and the end part of the interlayer insulating film 122, and thereby it is possible to prevent the light emitting element 130 from deteriorating.

Figure 12:
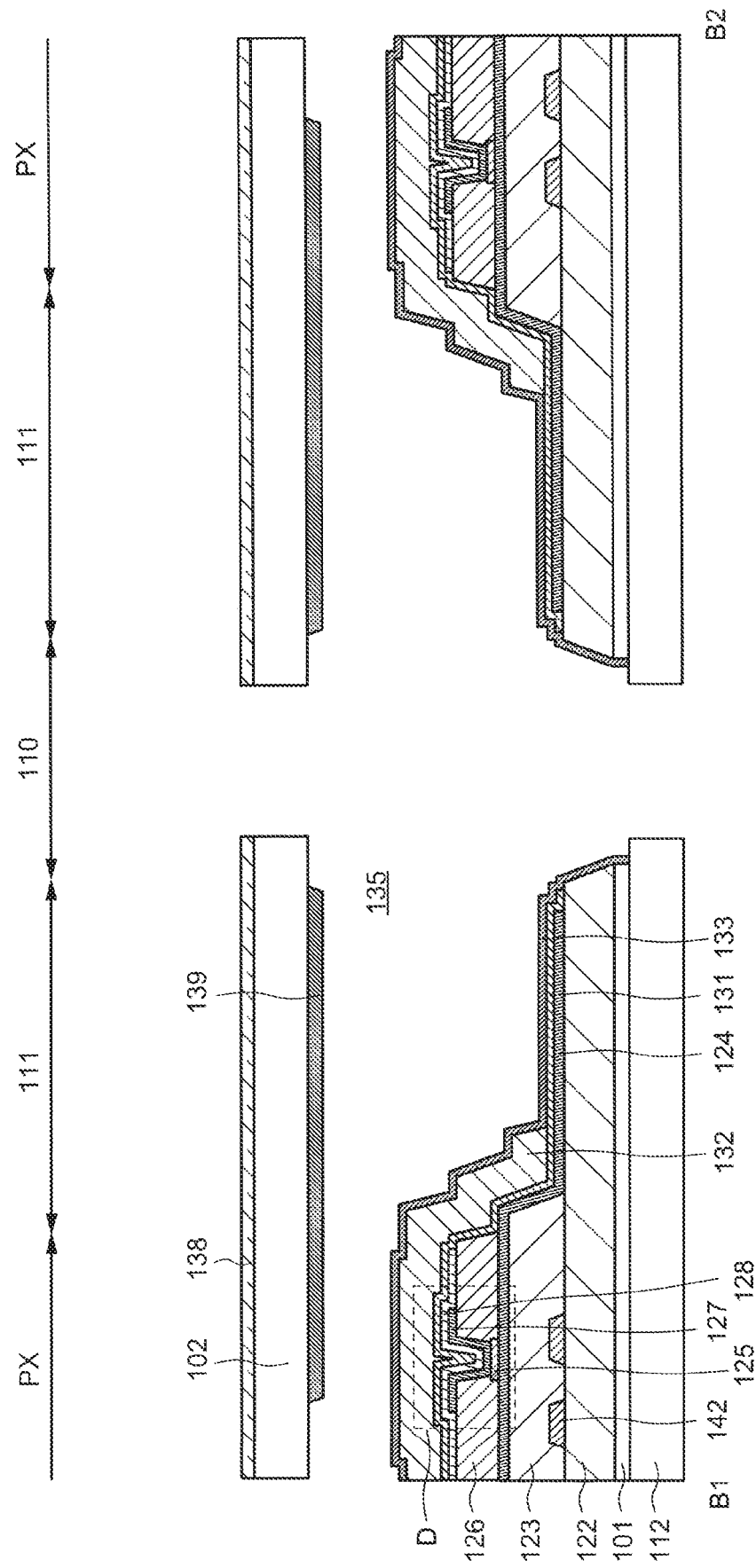
FIG. 12 is a cross-sectional view showing a structure of a display device related to one embodiment of the present invention.

The moisture blocking region 111 of the display device shown in FIG. 12 has a structure partially different from the moisture blocking region 111 of the display device shown in FIG. 11. Specifically, in the moisture blocking region 111, the organic insulating layer 132 is arranged above the first inorganic insulating layer 131, and the second inorganic insulating layer 133 is arranged above the organic insulating layer 132. Here, a structure is adopted in which an end part of the protective film 124 is covered by the first inorganic insulating layer 131, and an end part of the first inorganic insulating layer 131 is covered by the second inorganic insulating layer 133. In addition, the second inorganic insulating layer 133 is arranged in contact with the first inorganic insulating layer 131. In addition, the first inorganic insulating layer 131 and the second inorganic insulating layer 133 is arranged in contact with an end part of the organic insulating layer 132, the end parts of the interlayer insulating film 122, and the end part of first substrate 101. Moisture and oxygen can be prevented from entering from the end part of the first substrate 101, the end part of the interlayer insulating film 122, the end part of the protective film 124 and the end part of the first inorganic insulating layer 131 and thereby the light emitting element 130 can be prevented from deteriorating.

Figure 13:
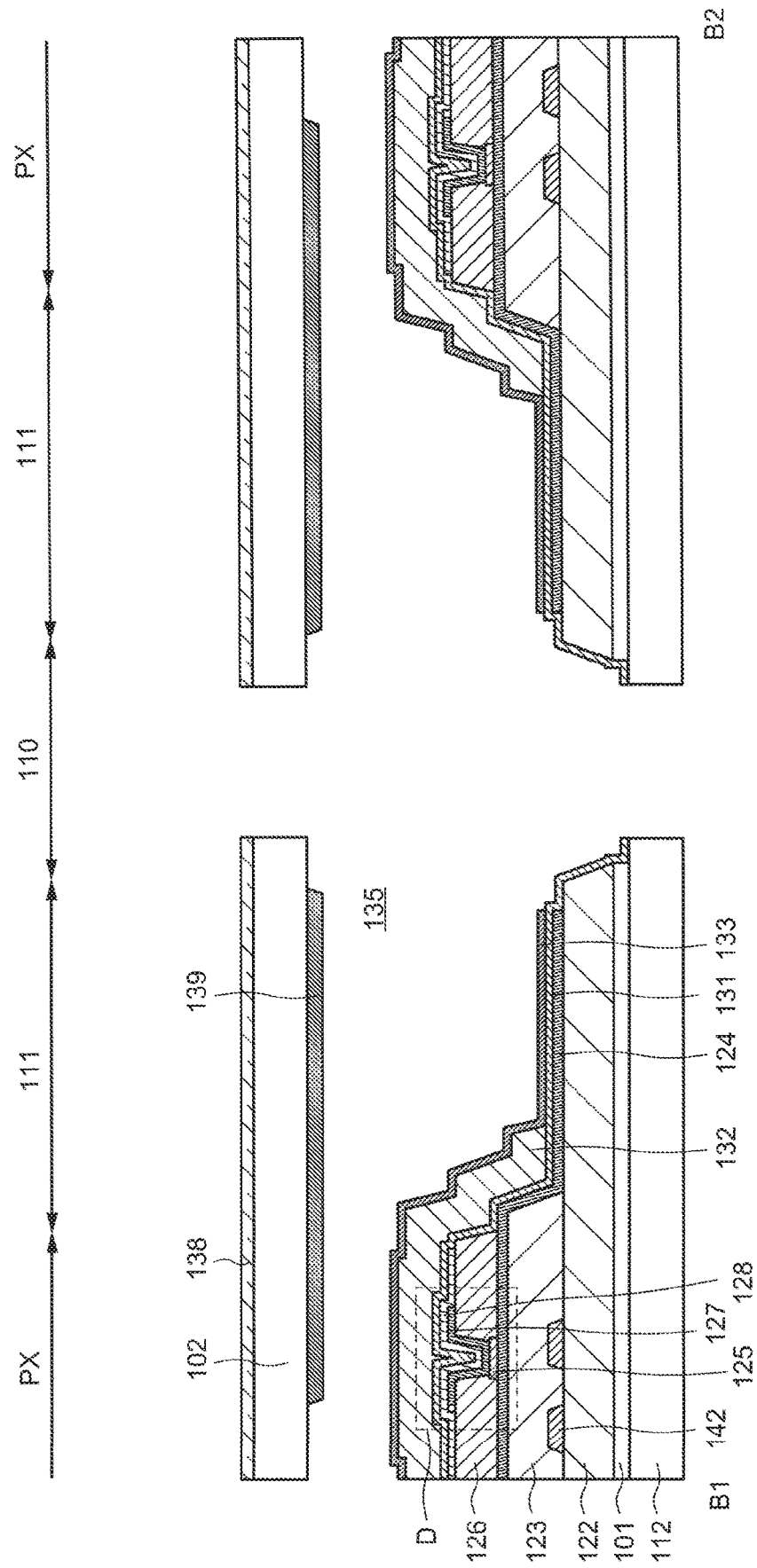
FIG. 13 is a cross-sectional view showing a structure of a display device related to one embodiment of the present invention.

Next, the moisture blocking region 111 of the display device shown in FIG. 13 has a structure that is partially different from the moisture blocking region 111 of the display device shown in FIG. 11. Specifically, in the moisture blocking region 11 the organic insulating layer 132 is arranged above the first inorganic insulating layer 131, and the second inorganic insulating layer 133 is arranged above the organic insulating layer 132. The first inorganic insulating layer 131 is arranged in contact with an end part of the protective film 124, an end part of the interlayer insulating film 122 and an end part of the first substrate 101. In addition, although the second inorganic insulating layer 133 covers an end part of the organic insulating layer 132, the end part of the second inorganic insulating layer 133 is patterned. It is possible to prevent moisture and oxygen from entering from the end part of the first substrate 101, the end part of the interlayer insulating film 122 and the end part of the protective film 124, and thereby it is possible to prevent the light emitting element 130 from deteriorating.

Figure 14:
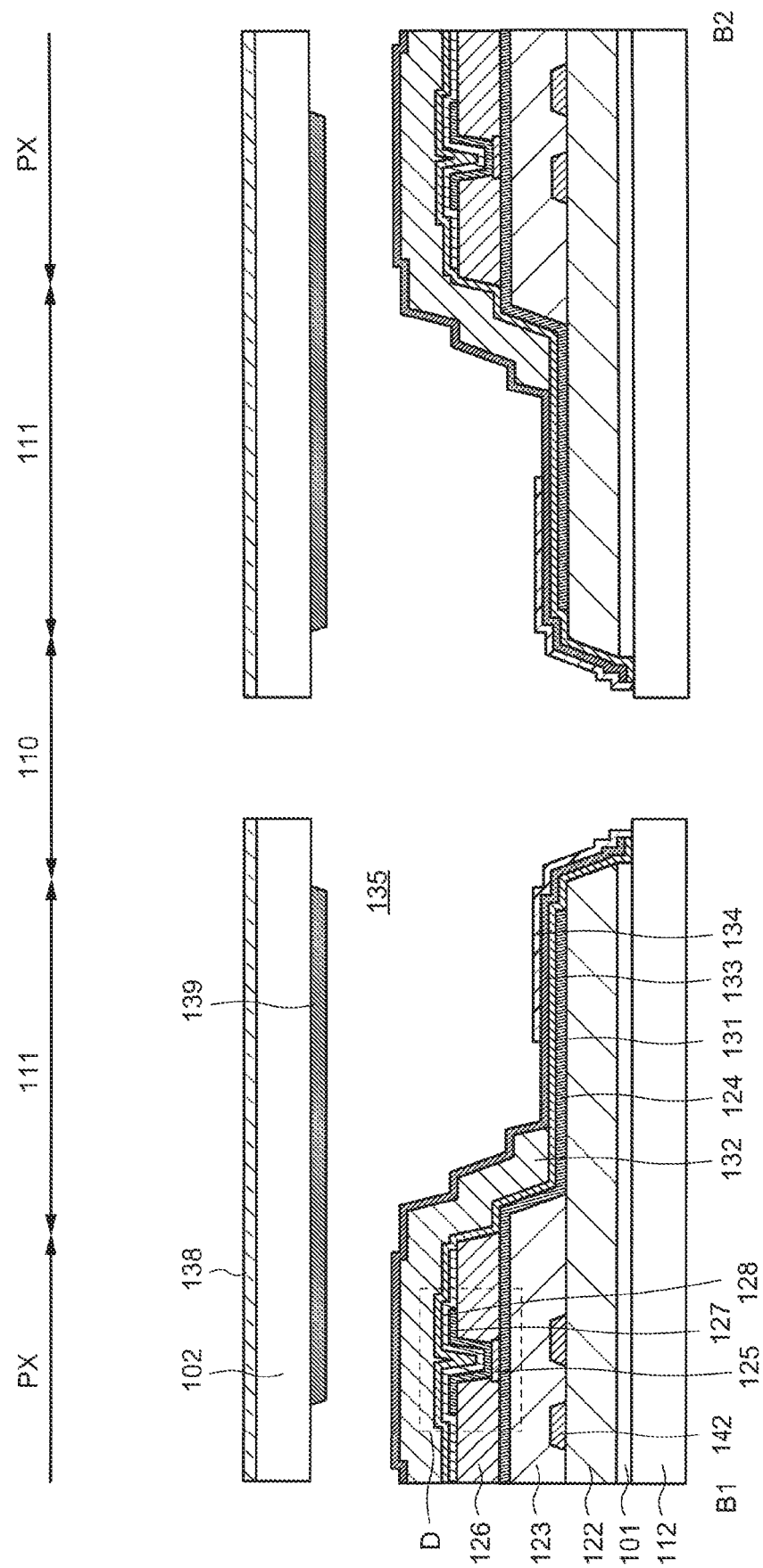
FIG. 14 is a cross-sectional view showing a structure of a display device related to one embodiment of the present invention.

Next, the moisture blocking region 111 of the display device shown in FIG. 14 is partially different from the moisture blocking region 111 of the display device shown in FIG. 11. Specifically, in the moisture blocking region 111, the organic insulating layer 132 is arranged above the first inorganic insulating layer 131, and the second inorganic insulating layer 133 is arranged above the organic insulating layer 132. In FIG. 14, the second insulating layer 134 covers an end part of the first substrate 101, an end part of the interlayer insulating film 122, an end part of the protective film 124, an end part of the first inorganic insulating layer 131, and an end part of the second inorganic insulating layer 133. The second insulating layer is preferably formed using the same material as the first inorganic insulating layer 131 and the second inorganic insulating layer 133. By arranging the second insulating layer 134 to cover the end parts of the plurality of insulating layers, it is possible to reinforce the end parts of the plurality of insulating layers. In addition, it is possible to prevent moisture and oxygen from entering from the end parts of the plurality of insulating layers and thereby prevent the light emitting element 130 from deteriorating.

Furthermore, although an example is shown FIG. 10 to FIG. 14 in which the convex part 143 shown in FIG. 6 or the convex part 145 shown in FIG. 7 is not arranged in the moisture blocking region 111, the structure shown in FIG. 10 to FIG. 14 may also be arranged with the convex part 143 and convex part 145 as appropriate.

[Manufacturing Method 3]

Figure 15:
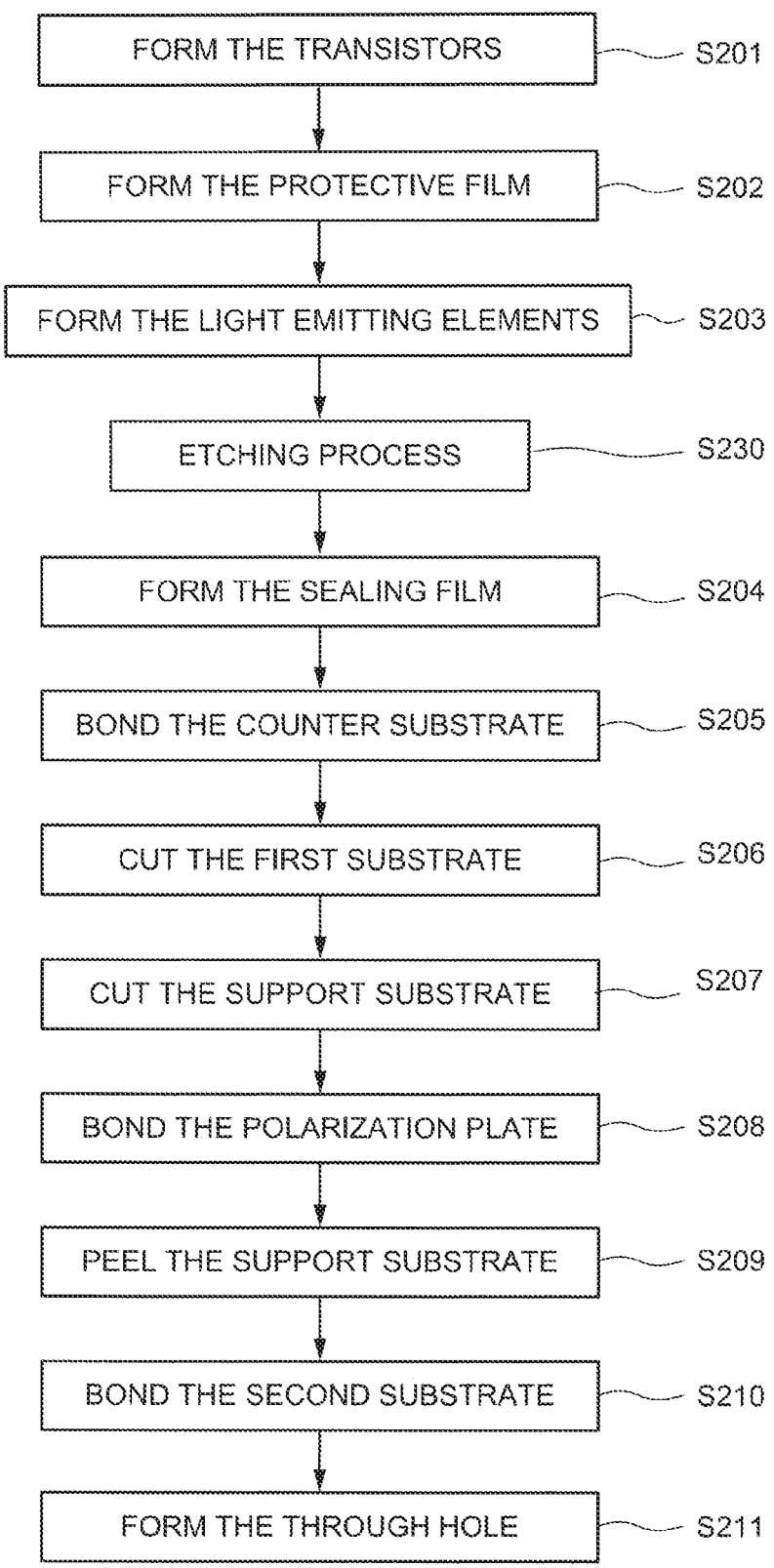
FIG. 15 is a diagram for explaining a manufacturing process of a display device related to one embodiment of the present invention.

A process flow of the display device shown in FIG. 10 to FIG. 14 is shown in FIG. 15. The process flow shown in FIG. 15 differs from the process flow shown in FIG. 9 in the order of formation of the sealing film and etching process. A step of forming a sealing film and a step of etching processing is explained while referring to FIG. 15 and an explanation of other steps is omitted.

As shown in FIG. 15, after the light emitting element 130 is formed in step S203, an etching process is performed on the interlayer insulating film 122 and the first substrate 101 (step S230). By performing the etching process, the interlayer insulating film 122 and the first substrate 101 are removed in a region where the through hole 110 is subsequently formed.

Next, a first inorganic insulating layer 131 which functions as a sealing film is formed (step S204). In this way, an end part of the protective film 124, an end part of the interlayer insulating film 122, and an end part of the first substrate 101 are formed so as to be covered by the first inorganic insulating layer 131. In this way, it is possible to obtain the structure of the display device shown in FIG. 10.

In addition, in step S204 in FIG. 15, the end part of the protective film 124, the end part of the interlayer insulating film 122, and the end part of the first substrate 101 are covered by the first inorganic insulating layer 131. Next, the organic insulating layer 132 is formed above the first inorganic insulating layer 131 and the second inorganic insulating layer 133 is formed above the organic insulating layer 132. The second inorganic insulating layer 133 is formed so as to cover an end part of the protective film 124, an end part of the interlayer insulating film 122, and an end part of the first substrate 101 via the first inorganic insulating layer 131. In this way, it is possible to obtain the structure of the display device shown in FIG. 11.

In addition, in step S204 in FIG. 15, after the formation of the first inorganic insulating layer 131, the first inorganic insulating layer 131 is patterned and then the organic insulating layer 132 is formed and then the second inorganic insulating layer 133 is formed. The second inorganic insulating layer 133 is formed to cover an end part of the first inorganic insulating layer 131, an end part of the protective film 124, an end part of the interlayer insulating film 122, and an end part of the first substrate 101. In this way, it is possible to obtain the structure of the display device shown in FIG. 12.

In addition, in step S204 in FIG. 15, the first inorganic insulating layer 131 is formed so as to cover an end part of the protective film 124, an end part of the interlayer insulating film 122, and an end part of the first substrate 101. After forming the first inorganic insulating layer 131, the organic insulating layer 132 is formed, and the second inorganic insulating layer 133 is formed above the organic insulating layer 132. After this, the second inorganic insulating layer 133 is patterned. In this way, it is possible to obtain the structure of the display device shown in FIG. 13.

In addition, in step S204 in FIG. 15, the end part of the protective film 124, the end part of the interlayer insulating film 122, and the end part of the first substrate 101 are covered by the first inorganic insulating layer 131. Next, the organic insulating layer 132 is formed above the first inorganic insulating layer 131, and the second inorganic insulating layer 133 is formed above the organic insulating layer 132. The second inorganic insulating layer 133 is formed so as to cover an end part of the protective film 124, an end part of the interlayer insulating film 122, and an end part of the first substrate 101 via the first inorganic insulating layer 131. Furthermore, the second insulating layer 134 is formed above the second inorganic insulating layer 133 covering an end part of the first substrate 101, an end part of the interlayer insulating film 122, an end part of the protective film 124, an end part of the first inorganic insulating layer 131, and an end part of the second inorganic insulating layer 133. In this way, it is possible to obtain the structure of the display device shown in FIG. 14.

Since the steps after the counter substrate bonding step (step S205) shown in FIG. 15 are the same as the steps shown in FIG. 8, a detailed explanation is omitted.

[Manufacturing Method 4]

Figure 16:
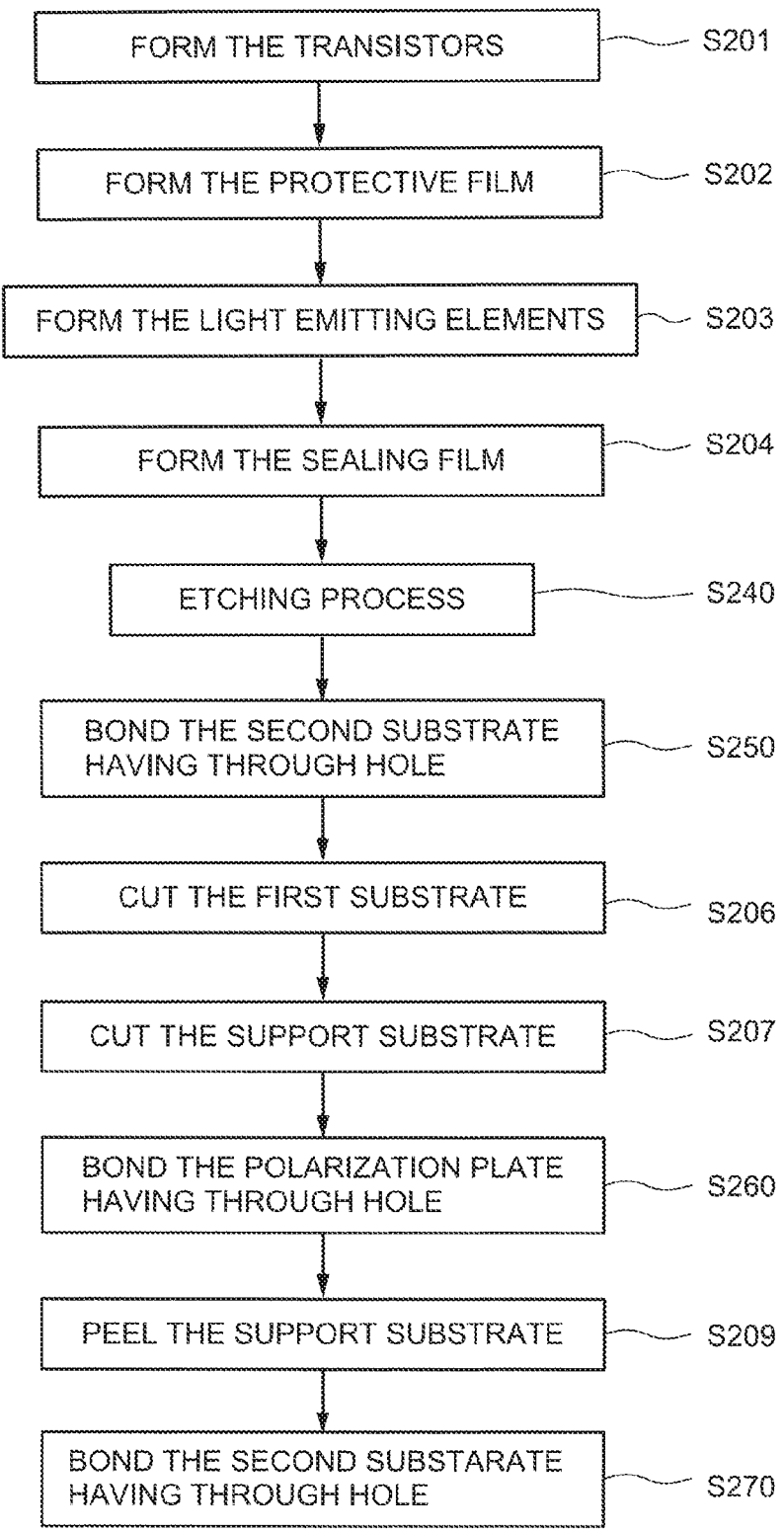
FIG. 16 is a diagram for explaining a manufacturing process of a display device related to one embodiment of the present invention.

A process flow partly different from the process flow shown in FIG. 9 is explained in FIG. 16. Specifically, the process after step S204 shown in FIG. 16 is different from the process flow shown in FIG. 9.

In the process flow of FIG. 9, after the sealing film is formed in step S204, the region where the through hole 110 is subsequently formed is etched until the support substrate is exposed, that is, up to the first substrate 101 which is in direct contact with the support substrate (step S240). The etching treatment may be dry etching or wet etching. In step S240, an etching process is performed on the region where the through hole 110 is subsequently formed to remove the first substrate 101 and the sealing film.

Next, the first substrate 101 on which the transistor 120 and the light emitting element 130 are formed is bonded to the counter substrate 102 via the filler 135 (step S250). In this step, a substrate having a hole is used as the counter substrate 102 in a region where the through hole 110 is to be subsequently formed.

Next, the bonded first substrate 101 and counter substrate 102 are cut according to the shape of the display device or to a size larger than the shape of the display device (step S206). Scribing and breaking with a scribing wheel, punching cutting, laser cutting, and combinations thereof can be used as a method of cutting the first substrate 101.

Next, the support substrate is cut (step S207). Scribing and breaking with a scribing wheel, punching cutting, laser cutting, and combinations thereof can be used as a cutting method of the supporting substrate.

Next, the polarization plate 138 is bonded to the counter substrate 102 (step S260). Also in this step, a polarization plate having a hole is used in a region where the through hole 110 is subsequently formed as the polarization plate 138. After this, a step of mounting a driver IC on the first substrate 101 may be included.

Next, the first substrate 101 is peeled from the support substrate by irradiating the first substrate 101 with a laser through the support substrate (step S209).

Next, the second substrate 112 is bonded to the rear surface of the first substrate 101 (step S270). Also in this step, a substrate having a hole is used in a region where the through hole 110 is arranged as the second substrate 112. After this, in the case when cutting is performed at a size larger than the shape of the display device in step S206, the periphery of the array substrate and the counter substrate 102 is cut so as to adjust the outer shape of the display device.

A display device can be manufactured by the steps described above. In the process flow shown in FIG. 16, the counter substrate 102, second substrate 112 and polarization plate 138 having holes are used in a region where the through hole 110 is arranged. In this way, it is possible to omit the step of forming through holes by a mechanical processing method on the array substrate and the counter substrate 102. In addition, it is possible to prevent damage to the first substrate 101 and the sealing film and the like by forming a through hole by a mechanical processing method. In this way, it is possible to prevent moisture and oxygen or the like from entering from the damage to the first substrate 101 and the sealing film and prevent moisture and oxygen or the like entering the light emitting element 130. In this way, a highly reliable display device can be provided.

FIRST EXAMPLE

Figure 17:
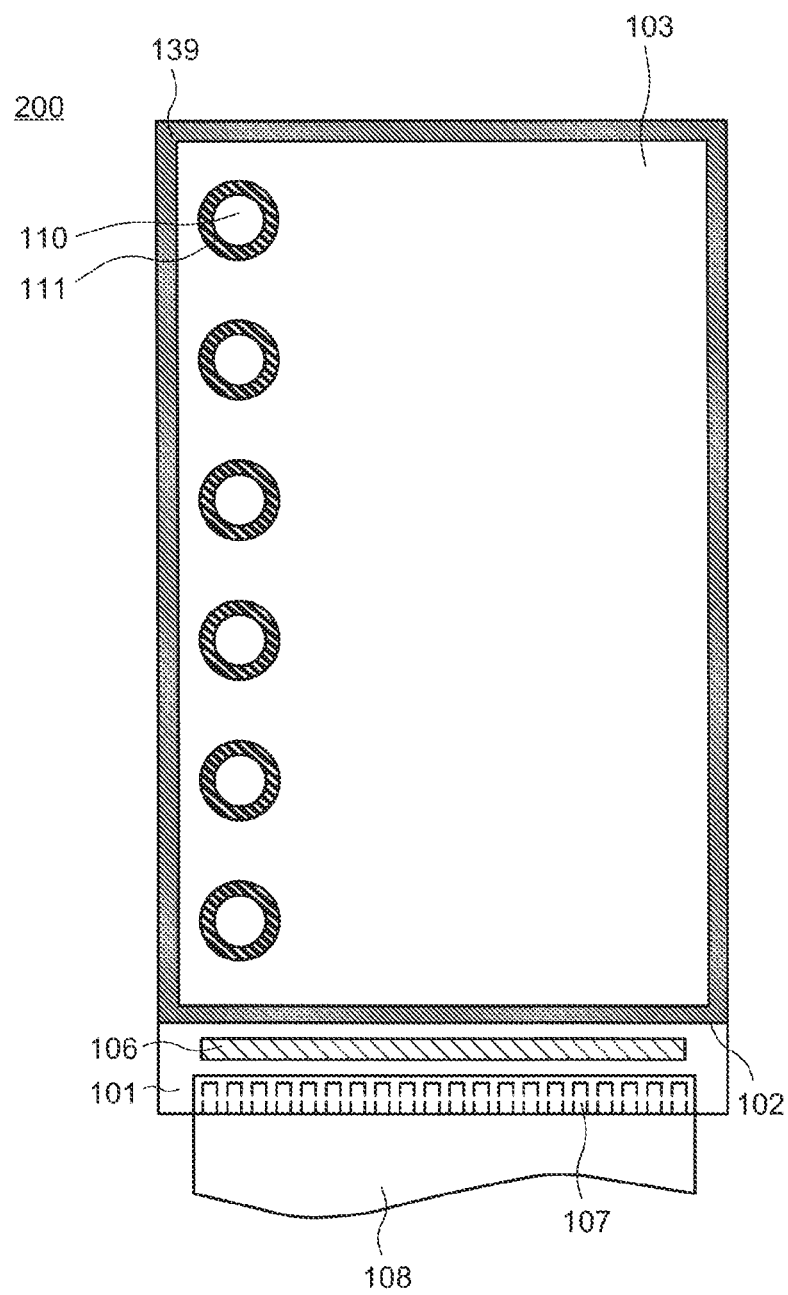
FIG. 17 is a diagram showing an example of a structure of a display region in a display device.
Figure 18:
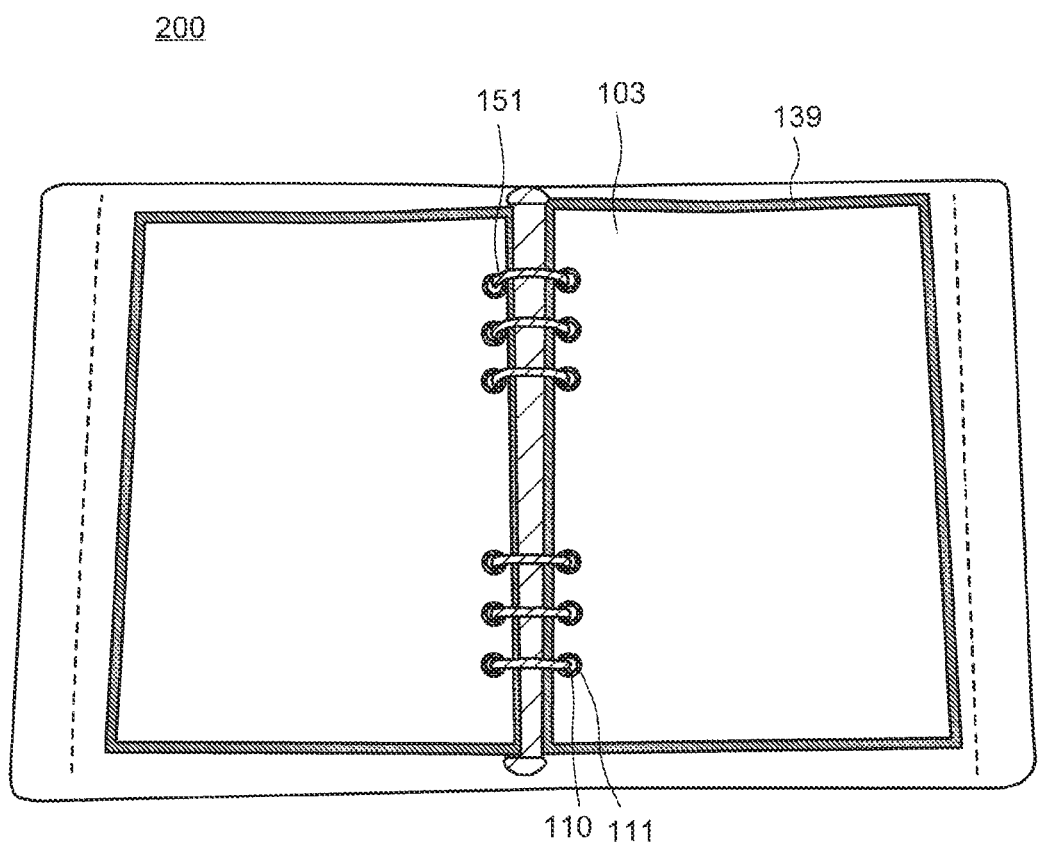
FIG. 18 is a diagram showing an example of a structure of a display region in a display device.

Examples of the display device according to the present invention are explained while referring to FIG. 17 and FIG. 18. In the display device 200 shown in FIG. 17, a plurality of through holes 110 are arranged in the display region 103. In FIG. 17, six through holes 110 are arranged vertically. In addition, the display device 200 has a display region 103, a driver IC 106, a terminal 107, and a flexible printed circuit 108 above the first substrate 101 as an array substrate. In addition, a light shielding layer 139 is arranged on the counter substrate 102 on the side facing the array substrate. The array substrate and the counter substrate 102 are bonded to each other with a filler interposed therebetween. Furthermore, in the array substrate, a scanning line driving circuit or the like may be formed in a region overlapping with the light shielding layer 139 of the counter substrate 102.

In the display device 200, six through holes 110 are arranged passing through the array substrate and the counter substrate 102, and a moisture blocking region 111 is arranged in a region surrounding the through hole 110. By arranging the moisture blocking region 111 in the region surrounding the through hole 110, it is possible to prevent moisture and oxygen from entering from the through hole 110. In this way, it is possible to prevent moisture and oxygen from entering into the light emitting element formed in the display region 103, thereby deterioration of the light emitting element can be prevented. As a result, reliability of the display device can be improved.

A case where the display device 200 is applied as a refill of a notebook is shown in FIG. 18. As shown in FIG. 18, by arranging six through holes 110 passing through the array substrate and the counter substrate 102 in the display device 200, it is possible to pass the through hole 110 through a metal part 151 of the notebook. In addition, by arranging the moisture blocking region 111 in the region surrounding the through hole 110, it is possible to prevent moisture and oxygen from entering from the through hole 110. For example, in the case when the diameter of the through hole 110 is 7000 µm, the width of the moisture blocking region 111 (the length from the end of the through hole 110 to the region where a pixel is formed) is 1200 µm. In this case, the non-display width in the display region 103 is 9400 µm. As shown in the present example, according to the present invention, it is possible to provide a display device with a high level of freedom in appearance design.

SECOND EXAMPLE

Figure 19:
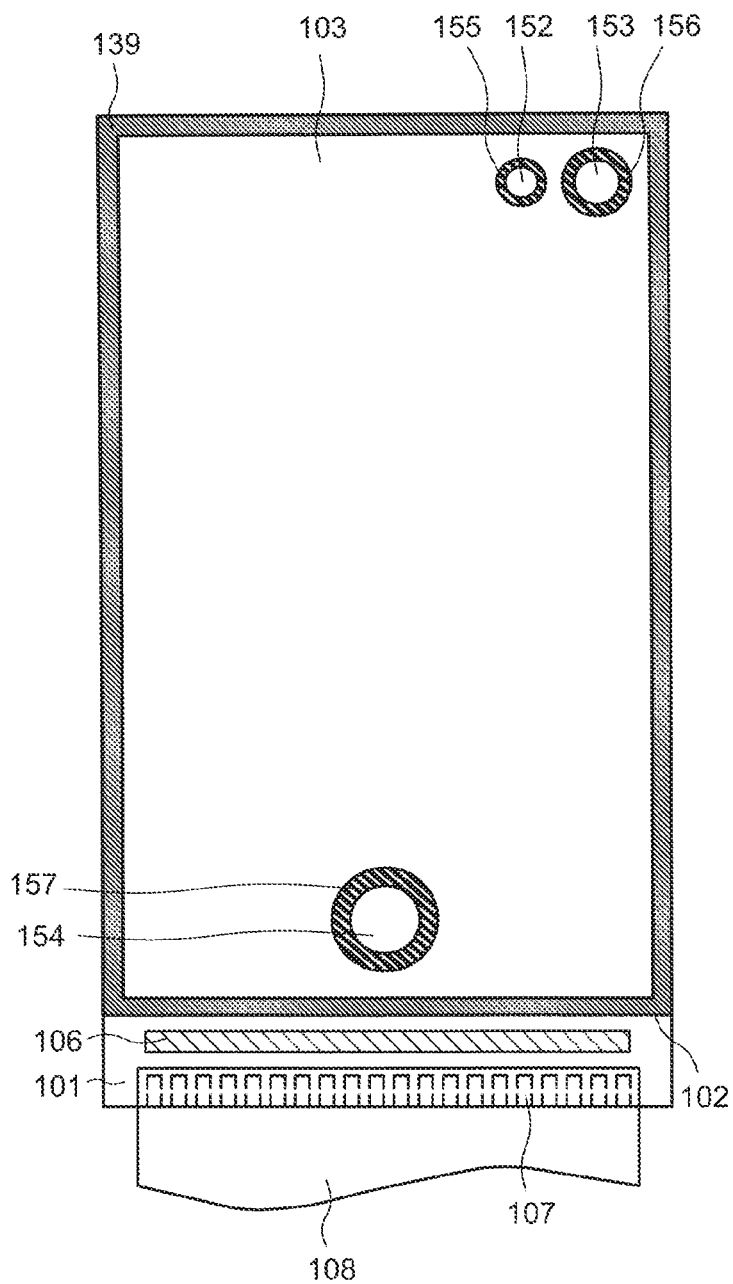
FIG. 19 is a diagram showing an example of a structure of a display region in a display device.
Figure 20:
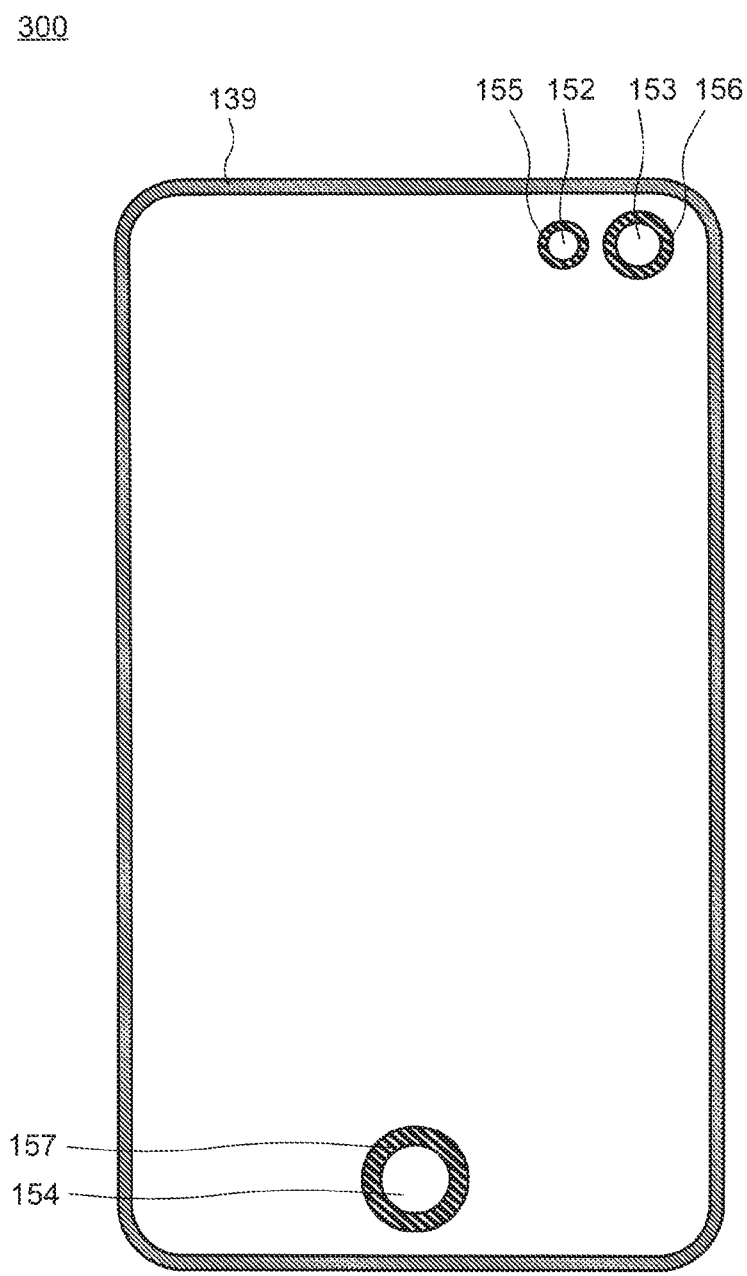
FIG. 20 is a diagram showing an example of a structure of a display region in a display device.

An example of the display device according to the present invention is explained while referring to FIG. 19 and FIG. 20. In the display device 300 shown in FIG. 19, three through holes 110 are arranged in the display region 103. In addition, the display device 300 has a display region 103, a driver IC 106, a terminal 107, and a flexible printed circuit 108 above the first substrate 101 as an array substrate. In addition, a light shielding layer 139 is arranged in the counter substrate 102 on the side facing the array substrate. The array substrate and the counter substrate 102 are bonded to each other with a filler interposed therebetween. Furthermore, in the array substrate, a scanning line driving circuit or the like may be formed in a region overlapping with the light shielding layer 139 of the counter substrate 102.

In the display device 300 shown in FIG. 19, three through holes are arranged in the display region 103. The diameters of the through hole 152, the through hole 153, and the through hole 154 are different from each other. Each of the through holes 152, 153, and 154 is surrounded by each moisture blocking region 155, 156, and 157. In addition, the width of the moisture blocking region (the length from the end of the through hole to the region where a pixel is formed) can be appropriately set according to the diameter of the through hole. By providing the moisture blocking regions 155, 156, and 157 in the region surrounding the through holes 152, 153, and 154, it is possible to prevent moisture and oxygen from entering from the through holes 152, 153, and 154. In this way, it is possible to prevent moisture and oxygen from entering into the light emitting element formed in the display region 103, thereby deterioration of the light emitting element can be prevented. As a result, reliability of the display device can be improved.

A case where the display device 300 is applied to a smartphone is shown in FIG. 20. In the display device 300, an illuminance sensor can be fitted in the through hole 152, and a camera, for example, can be fitted in the through hole 153. In addition, a home button can be arranged in the through hole 154. In the case of fitting an illuminance sensor in the through hole 152, the diameter of the through hole 152 is set to 3000 µm and the moisture blocking region 155 is set to 800 µm. In this case, the non-display width in the display area is 4600 µm. In the case of fitting a camera in the through hole 153, the diameter of the through hole 153 is set to 4000 µm, and the moisture blocking region 156 is set to 900 µm. In this case, the non-display width in the display area is 5800 µm. In the case when a home button is arranged in the through hole 153, the diameter of the through hole 154 is set to 10000 µm and the moisture blocking region 157 is set to 1550 µm. In this case, the non-display width in the display area is 13100 µm.

A person skilled in the art could appropriately add, delete or change design elements on the basis of the display device explained as embodiments and examples of the present invention, or those in which addition, omission, or changes in conditions of the processes are also included in the scope of the present invention as long as they do not depart from the concept of the present invention. In addition, each of the embodiments described above can be combined with each other within a range where no technical contradiction occurs.

In addition, even if other actions and effects different from the actions and effects brought about by modes of the embodiments described above are obvious from the description of the present specification or those which can be easily predicted by a person skilled in the art, they are naturally to be interpreted as belonging to the present invention.

What is claimed is:

1. A display device comprising:
   a first substrate;
   a plurality of pixels above the first substrate, each of the pixels including a light emitting element and a thin film transistor;
   a display region including the plurality of pixels;
   a first inorganic insulating film located between the thin film transistor and the light emitting element;
   a sealing film which includes a second inorganic insulating film covering the light emitting element, and is located on an upper side of the light emitting element;
   a second substrate located on an upper side of the sealing film; and
   a through hole located in the display region;
   wherein
   the display region includes a first region between the through hole and the plurality of pixels,
   the through hole passes through the first substrate, the first inorganic insulating film, the second inorganic insulating film, and the second substrate,
   the second inorganic insulating film is in direct contact with the first inorganic insulating film in the first region,
   an end part of the first inorganic insulating film is arranged in the first region, and the sealing film is in contact with a side surface of the end part of the first inorganic insulating film, and
   the end part of the first inorganic insulating film is not exposed to the through hole.

2. The display device according to claim 1, wherein the sealing film includes the second inorganic insulating film, an organic insulating film, and a third inorganic insulating film.

3. The display device according to claim 1, wherein the second substrate is a polarization plate.

4. The display device according to claim 1, further comprising:
   a third inorganic insulating film provided between the first substrate and the first inorganic insulating film,
   wherein the sealing film is in contact with a top surface and the side surface of the first inorganic insulating film and a top surface of the third inorganic insulating film.

* * * * *